United States Patent [19]

Harnden, Jr. et al.

[11] E Patent Number: Re. 33,568

[45] Reissued Date of Patent: Apr. 9, 1991

[54] PIEZOELECTRIC CERAMIC SWITCHING DEVICES AND SYSTEMS AND METHODS OF MAKING THE SAME

[75] Inventors: John D. Harnden, Jr., Schenectady; William P. Kornrumpf, Albany, both of N.Y.

[73] Assignee: General Electric Company, Fort Wayne, Ind.

[21] Appl. No.: 360,228

[22] Filed: Jun. 1, 1989

Related U.S. Patent Documents

Reissue of:

[64] Patent No.: 4,678,957
Issued: Jul. 7, 1987
Appl. No.: 879,495
Filed: Jun. 24, 1986

U.S. Applications:

[62] Division of Ser. No. 685,109, Dec. 21, 1984, Pat. No. 4,670,682.

[51] Int. Cl.[5] ..... H01L 41/08

[52] U.S. Cl. ..... 310/332

[58] Field of Search ..... 310/330–332, 310/340, 344, 317, 357–359, 368, 367; 200/181

[56] References Cited

U.S. PATENT DOCUMENTS

| | | | |
|---|---|---|---|
| 2,166,763 | 7/1939 | Mason | 310/332 |
| 2,471,967 | 5/1949 | Mason | 310/332 |
| 2,479,926 | 8/1949 | Gravley | 310/332 |
| 2,633,543 | 3/1953 | Howatt | 310/330 |
| 2,714,642 | 8/1955 | Kinsley | 310/330 |
| 3,500,451 | 3/1970 | Yando | 310/330 |
| 3,622,815 | 11/1971 | Schafft | 310/330 |
| 4,093,883 | 6/1978 | Yamamoto | 310/330 |
| 4,392,074 | 7/1983 | Kleinschmidt et al. | 310/330 |
| 4,443,729 | 4/1984 | Rider | 310/330 |
| 4,538,087 | 8/1985 | Germano et al. | 310/330 |
| 4,553,061 | 11/1985 | Germano | 310/332 |
| 4,654,555 | 3/1987 | Ohba et al. | 310/331 |
| 4,663,555 | 5/1987 | Yoshihiro | 310/332 X |

FOREIGN PATENT DOCUMENTS

| | | | |
|---|---|---|---|
| 273157 | 7/1964 | Australia . | |
| 970817 | 7/1975 | Canada . | |
| 69545 | 6/1975 | Japan . | |
| 32456 | 7/1982 | Japan . | |
| 188673 | 10/1984 | Japan | 355/282 |
| 961606 | 6/1964 | United Kingdom . | |
| 2106450 | 4/1983 | United Kingdom | 355/290 |

OTHER PUBLICATIONS

Guntersdorfer, M. et al., "Application of Piezoceramics in Relays" *Electrocomponent Science and Technology*, vol. 3, 1976, pp. 1–11.

*Electronic Engineering*, by P. Kleinschmidt, "A Piezoelectric Ceramic Touch-Operated Button", Aug. 1975, pp. 9 and 11.

*Primary Examiner*—Mark O. Budd
*Attorney, Agent, or Firm*—Ralph E. Krisher, Jr.

[57] ABSTRACT

Improved piezoelectric ceramic switching devices are described along with their [method] *methods* of fabrication. In addition to the devices themselves, novel electric circuits are described for the energization as well as the use of such devices as switching elements in electrical systems. Parts of both the energization circuits and/or utilization circuits employing the piezo ceramic switching device are physically mounted on and supported by non-polarized parts of the piezoelectric ceramic plate elements comprising the switching devices so that lightweight compact construction is achieved along with substantial reduction of stray inductance intercoupling.

24 Claims, 6 Drawing Sheets

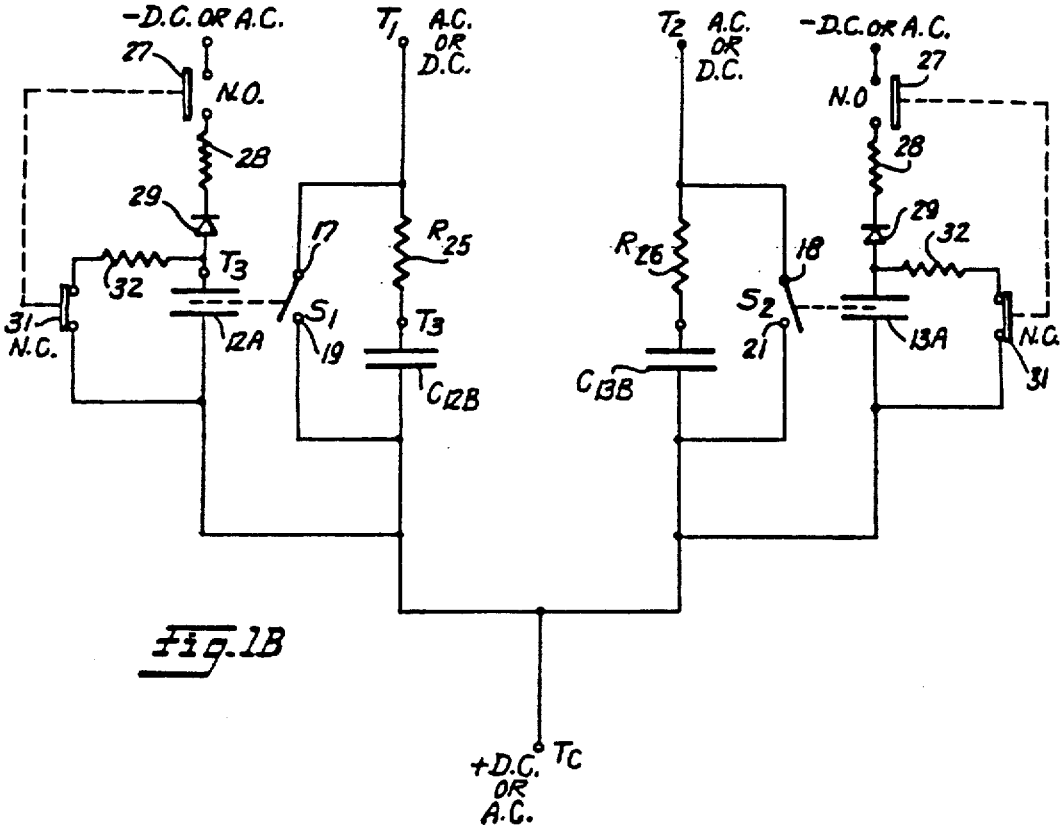
Fig. 1B
Fig. 7B
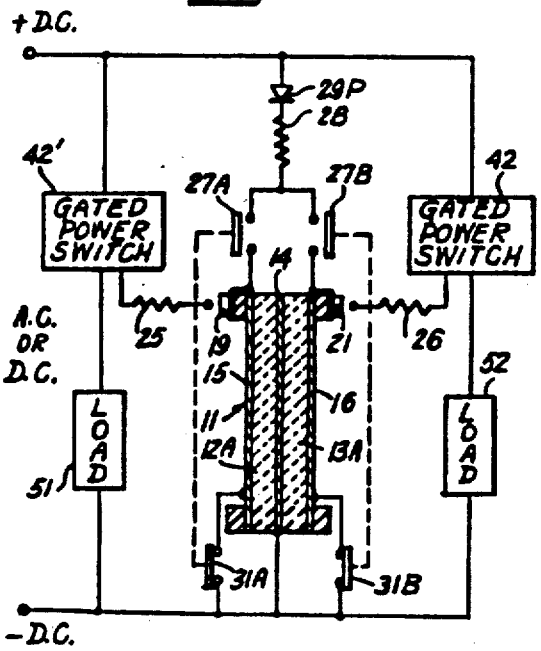
Fig. 7C
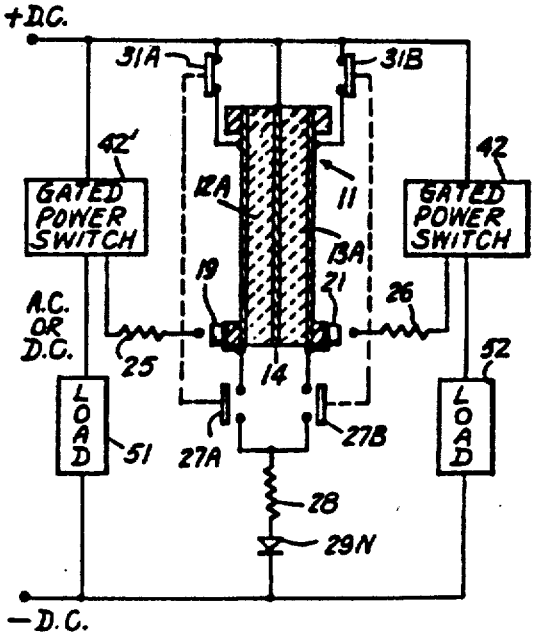

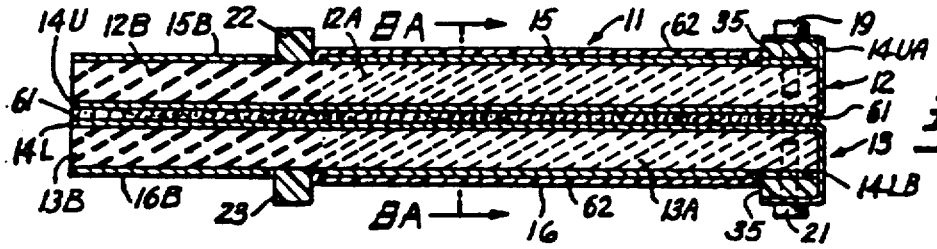
Fig. 8
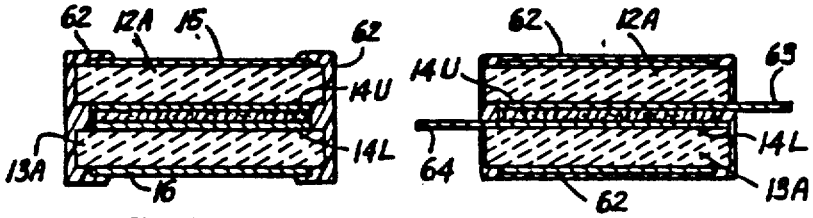
Fig. 8B
Fig. 8A
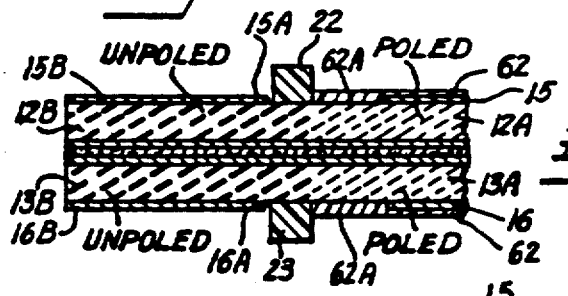
Fig. 8C
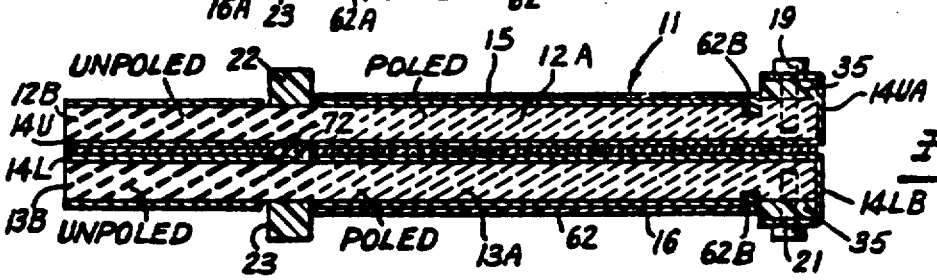
Fig. 9
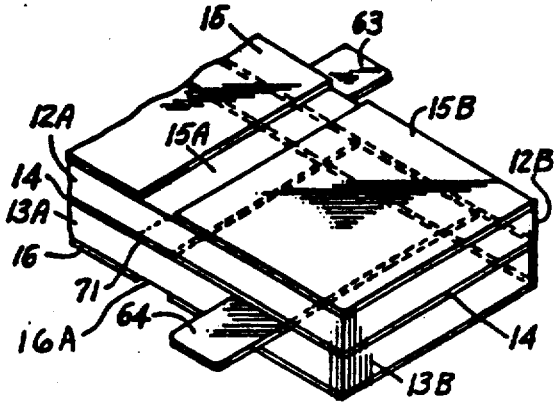
Fig. 10
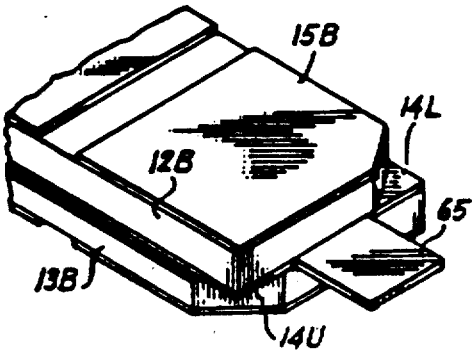
Fig. 11

LEGEND

A. GOOD, DENSE, FLAT SMOOTH SURFACE CERAMIC AND SEALED IN VACUUM

B. PIN HOLE FREE POLYIMIDE SILOXANE COPOLYMER SEALED AS PER SELECTIVE POLING AND FABRICATION

C. COATED LOW HUMIDITY

C'. PRIOR ART COATED HIGH HUMIDITY

D. POOR CERAMIC, ASSEMBLY AND NO COATING

PIEZOELECTRIC CERAMIC SWITCHING DEVICES AND SYSTEMS AND METHODS OF MAKING THE SAME

Matter enclosed in heavy brackets [ ] appears in the original patent but forms no part of this reissue specification; matter printed in italics indicates the additions made by reissue.

This application is a division of application Ser. No. 685,109, filed 12/21/84, now [abandoned] *U.S. Pat. No. 4,670,682.*

TECHNICAL FIELD

This invention relates to improved piezoelectric ceramic switching devices and to novel electrical systems for the energization, control and utilization of such devices.

More particularly, the invention relates to improved piezoelectric ceramic switching devices, their fabrication, and to novel electrical circuits for the energization as well as use of such improved devices as switching elements in electrical systems, some parts of which may be physically mounted on and supported by the improved piezoelectric ceramic switching devices themselves.

BACKGROUND PRIOR ART PROBLEM

In conventional electrical circuits electrical relays and switches are employed at points in such circuits where it is desired either to initiate or interrupt (or both) electric current flow through the circuit. In the past, electromagnetic solenoid operated switches and relays have been employed to either close or open the contacts of a power switch or relay in response to a small control signal (low voltage, low current) which initiates either closure or opening of the [contact] *contacts* of a larger power rated switch that thereafter controls current flow through the contacts to a circuit being supplied via the switch contacts.

Relays and switches which use piezoelectric drive elements have a number of advantages over their electromagnetic counterparts. For example, a piezoelectric driven relay or switch requires substantially lower current and dissipates very little power during operation to open or close a set of contacts in comparison to an electromagnetic driven device of the same rating. Additionally, piezoelectric driven switching devices have very low mass and therefore require less space and introduce less weight into circuit systems with which they are used. Additionally, piezoelectric driven switching devices possess very short actuation times. This, fast acting switching is possible with smaller and lower weight devices that dissipate less power and hence can operate with lower temperature rises if piezoelectric ceramic switching devices are used.

Piezoelectric plate elements may be fabricated from a number of different polycrystalline ceramic materials such as barium titanate, lead zirconate titanate, lead metaniobate and the like which are precast and fired in a desired shape, such as a rectangular-shaped plate. Electrically conducting surfaces in the form of metalized electrodes usually are deposited on the surface of the plates which then are used to apply a polarizing voltage across the piezoceramic plate in order to make them piezoelectric in a chosen polar direction by a prepoling treatment which involves exposing the ceramic plates to a high electric field applied across the [metalized] *metallized* electrode while the plates are held at a temperature not far below their Curie point. As a result of this prepolarizing treatment, the plate elongates in the same direction as the applied field. After cooling of the plates and removal of the prepoling field, the dipoles within the ceramic plate which were aligned as a result of the prepoling treatment, cannot easily be returned to their original position and therefore possess what is known as [remanant] *remanent* polarization. Thus, the ceramic plates are made permanently piezoelectric whereby the mechanical energy into electrical energy, and vice versa. The piezoelectric effect is described more fully in a booklet entitled "The Piezoelectric Effect in Ceramic Materials" edited by J. Van Randeraat & R. E. Setterington and published by Philips Golilamperfabriken Eindhoven, The Netherlands, second edition, dated January 1924.

In piezoelectric materials, the direction of the electrical and mechanical dipole axes depends upon the direction of the original unidirectional prepolarizing high voltage field. During the prepoling process the ceramic plate element experiences a permanent increase in dimension between the poling electrodes and a permanent decrease in dimension parallel to the electrodes. When a DC excitation voltage of the same polarity as the prepoling voltage, but of smaller magnitude, subsequently is applied between the poling electrodes, the element experiences further but temporary expansion in the poling direction and contraction parallel to the electrodes. Conversely, when a DC excitation voltage of opposite polarity is applied to the plate element electrodes, the plate contracts in the poling direction and expands parallel to the electrodes. In either case, the piezoelectric ceramic plate element returns to its original prepolarized dimensions when the later applied excitation voltage is removed from the electrodes.

A number of different piezoelectric ceramic switching devices have been offered for sale in the past having a variety of different configurations. One of the more popular, if not the prevailing structural approach employed in the past, is known as a bimorph bender-type piezoelectric ceramic plate elements mounted side by side having conductive electrodes[,] coating their outer surfaces and sharing a common conductive inner surface to form a bimorph [bender-tye] *bender-type* device. A known commercially available bimorph bender-type piezoelectric ceramic switch is described in an application note copyrighted in 1978 and published by the Piezo Products Division of Gluton Industries Inc. located in Metuchen, New Jersey, and Fullerton California. If one end of such a piezoelectric ceramic bimorph bender is clamped cantilever fashion, the bender can be made to bend in either direction from its central neutral unenergized condition by application of an energizing potential of either polarity but lower than the prepolarizing potential to one of its conductive outer electrodes. If a suitable value energizing potential of either polarity is applied across only one of the piezoelectric ceramic plate elements of the bender, it enhances dipole alignment of that particular plate element resulting in a shortening and thickening of the plate element. This in turn results in bending of the overall bimorph bender device due to the fact that the two piezoelectric plate elements are physically secured together. By suitable design, the bending action can result in the closing of two switch contacts or other similar effect.

Unfortunately, prior art attempts to provide piezoelectrically driven switch devices have resulted in devices having poor electrical and mechanical performance characteristics. In the case of prior art bimorph bender-type switching devices as described briefly above, they possess severe performance limitations which are founded in the trade-offs between contact force, contact separation, depolarization, retentivity and reliability in service and the [uncertainity] *uncertainty* of contact position due to creep and temperature effects which build up over a period of continued device usage. One such prior art switching device employing a piezoelectric bender-type drive member is described in U.S. Pat. No. 2,166,763 issued July 18, 1939 for a "Piezoelectric Apparatus and Circuits". The piezoelectric bender-type drive member described in U.S. Pat. No. 2,166,763 is comprised by two juxtaposed piezoelectric plate elements having electrodes as described briefly above, and is energized in such a manner that one of the piezoelectric plate elements has the energizing potential applied to it in the same direction as the direction of the prepoling electric field; however, the other piezoelectric plate element has an energizing signal applied thereto of opposite polarity from that of its prepolarizing electric field. As a consequence, the device of U.S. Pat. No. 2,166,763 undergoes long term depolarization of either one or both of the piezoelectric plate elements after a period of usage due to the depolarizing effect of the repeated application of a wrong polarity (out of phase anti-poling direction) energizing signal. The deleterious effect on dipole enhancement of operation in this mode greatly restricts the applied voltage stress and thus the useful work output obtainable with such devices. In addition, the device of this prior art patent possess a number of other weaknesses sought to be overcome by the present inventon. The same objectionable characteristics are present in a number of different prior art piezoelectric driven bender-type switches and/or relay devices such as the following: U.S. Pat. No. 2,182,340—issued Dec. 5, 1939 for "Signaling System"; U.S. Pat. No. 2,203,332—issued June 4, 1950 for "Piezoelectric Device"; U.S. Pat. No. 2,227,268—issued Dec. 31, 1940 for "Piezoelectric Apparatus"; U.S. Pat. No. 2,365,738—issued Dec. 26, 1944 for "Relay"; U.S. Pat No. 2,714,642—issued Aug. 2, 1955 for "High Speed Relay of Electromechanical Transducer Material"; U.S. Pat. No. 4,093,883—issued June 6, 1978 for "Piezoelectric Multimorph Switches"; U.S. Pat. No. 4,395,651—issued July 26, 1983 for "Low Energy Relay Using Piezoelectric Bender Elements"; and U.S. Pat. No. 4,403,166—issued Sept. 6, 1983 for "Piezoelectric Relay with Oppositely Bending Bimorphs". In addition to the above prior art patented piezoelectric bender-type switching devices, the textbook "Manual of Electromechanical Devices" by Douglas C. Greenwood published by McGraw-Hill Book Company and copyrighted in 1965 discloses a somewhat similar piezo ceramic switching device on page 64 thereof.

In order to overcome the shortcomings of the known prior art piezoelectric ceramic driven relays and switches such as those listed above, the present invention was devised.

SUMMARY OF INVENTION

It is therefore a primary object of the present invention to provide new and improved piezoelectric ceramic switching devices of novel construction having better operating characteristics than those of comparable prior art devices of the same general nature.

Another object of the invention is to provide improved energization circuit designs for use with piezo ceramic switching devices which provide improved longevity and greater reliability in operation to such piezo ceramic switching devices over extended periods of service requiring substantial numbers of switching operations.

Still another object of the invention is to provide improved piezoelectric ceramic switching devices and circuits therefor having the above-listed characteristics wherein many of the components employed in either the energization and/or utilization circuits employing such devices are formed or otherwise supported on an inactive unpolarized portion of the piezoelectric ceramic switching device thereby reducing to a minimum stray inductance of the circuits and enhancing miniaturization and batch processing.

A still further object of the invention is to provide improved piezoelectric ceramic switching devices which themselves carry and selectively close or open power rated switch contacts for controlling current flow therethrough or, alternately, provide a sufficient electric discharge current to the control gate of a gate turn-on/turn-off semiconductor power switch such as an SCR, triac or transistor to cause it to turn on and conduct current or to turn off and block current flow selectively.

In practicing the invention, a novel piezoelectric ceramic switching circuit and bender-type piezoelectric ceramic switching device is provided wherein the piezoelectric ceramic switching device comprises at least two prepolarized piezoelectric plate elements having respective outer conductive surfaces and disposed on opposite sides of at least one central conductive surface sandwich fashion to which they are physically and electrically bonded. The piezo ceramic switching device coacts with a set of make and break electrical contacts to close or open such contacts and thereby make or break an electrically conductive path extending through the contacts. Selectively operable electric excitation circuit means are connected to the bender-type piezoelectric ceramic switching device for selectively and respectively exciting each piezoelectric plate element thereof with a direct current excitation electric field which is polarized and applied always in the same direction as the prepolarizing electric field enhancing dipole alignment previously permanently induced in the piezoelectric plate element whereby no depolarization of the piezoelectric plate element occurs during successive operations of the switch in order to close or open the make and break contacts. Further, continuous energization is not deleterious with the contacts opening the instant that charge is reduced in the bender.

The selectively operable electric excitation circuit means comprises respective switch energization circuit means connected in circuit relationship across respective ones of prepolarized piezoelectric plate elements of the piezo ceramic bender-type switching device for selectively closing or opening respective ones of the set of coacting electrical switch contacts for controlling electric current supplied through a load by opening and closing the contacts. Each switch energization circuit means selectively connects the [bender] *bender-type* switching device across a source of bender energization potential, a normally open low power rated user operated electric switch, a current limiting resistor and diode rectifier circuit means poled to provide an electric energization potential having the same polarity as the polarity of the prepolarizing potential used to polarize the prepoled dipole enhanced piezoelectric plate element of the piezoelectric bender-type switching device. The series electric circuit thus comprised is connected in seried circuit relationship across a respective one of the prepoled piezoelectric plate elements of the bender-type switch so that upon closure of the normally open low power rated user's switch, the respective prepolarized piezoelectric plate element of the bender-type piezoelectric switch selectively and respectively is excited with a direct current excitation field which always has the same polarity as the polarity of the prepoling electric field dipole enhanced alignment previously permanently induced in the respective piezoelectric plate element and no depolarization of the piezoelectric plate elements [occur] *occurs* during continued or successive operation of the piezoelectric bender-type switch device for closing and/or opening the load current controlling electric switch contacts.

The improved piezoelectric ceramic switching device comprises at least one piezoelectric bender-type switching device having two planar piezoelectric plate elements secured in opposed parallel relationship sandwich fashion on opposite sides of at least one central conductive surface and having respective outer conductive surfaces that are insulated from each other and the central conductive surface by the respective intervening piezoelectric plate element material thicknesses. The bender-type piezoelectric switching device further includes at least one set of coacting electrical switch contacts which are opened or closed by a prepolarized movable bender-portion of the piezoelectric ceramic switching device. The improved device further includes clamping means secured to a different portion of the bender-type piezoelectric ceramic switching device adjacent to and mechanically supporting the prepoled movable bender portion of the device cantilever fashion with the different portion of the piezoelectric ceramic plate elements comprising the bender-type device disposed under the clamping means being unpoled and electrically neutral.

In addition to being unpoled and electrically neutral, the different portion of the piezoelectric ceramic plate elements disposed under the clamping means have the outer conductive surfaces thereof removed from that portion which is disposed under the clamping means. In addition, a conformal electrically insulating protective coating covers at least some of the outer surfaces of the prepolarized movable portion of the bender-type piezoelectric device with the conformal electrically insulating protective coating comprising a polyimide siloxane copolymer.

In preferred embodiments of the invention, the conformal electrically insulating coating extends over and covers the outer planar conductive surfaces and the edges of the prepoled planar piezoelectric ceramic plate elements, and further extends over and covers the side edges of the piezoelectric ceramic plate [element] *elements* and their outer conductive surfaces and the outer edges of the central conductive surface sandwiched therebetween at least over the prepolarized portions of the device. Further, the conformal insulating coating covering the outer planar conductive surfaces of the prepolarized portions of the piezoelectric ceramic plate [element] *elements* also extends down to and covers the portions of the piezoelectric ceramic plate elements exposed by any removal of the outer conductive surfaces thereon as well as the edge portions of such outer conductive surfaces exposed by such removal.

BRIEF DESCRIPTION OF DRAWINGS

These and other objects, features and many of the attendant advantages of this invention will be appreciated more readily as the same becomes better understood by a reading of the following detailed description, when considered in connection with the accompanying drawings, wherein like parts in each of the several figures are identified by the same reference [characters,] *character* and wherein:

FIG. 1B is a top planar view of the movable bender end of the switching device shown in FIG. 1 in an unfinished condition during the manufacture thereof, and illustrates the manner of forming electric load current carrying contacts at the movable end of the bender-type piezo ceramic switching device;

FIG. 7B is a schematic circuit diagram of a second /pe of utilization load circuit which could be con- ·olled by the bidirectional acting piezoelectric ceramic witching device of FIG. 7 wherein the device is em- loyed to directly apply gating current to the gates of igher power rated, gated power semiconductor witches triggered by the device;

FIG. 7C is a schematic circuit diagram of a mirror nage of the circuit shown in FIG. 7B and illustrates ow inverse polarity voltages can be obtained to pro- ide negative polarity gating currents for use with ated power semiconductor switches of the turn-off /pe;

FIG. 8 is a longitudinal sectional view of a preferred mbodiment of piezoelectric ceramic bender-type witching device according to the invention wherein a onformal coating is provided over the active polarized ıovable bender portions of the device;

FIG. 8A is a cross sectional view of the device shown ı FIG. 8 taken through plane 8A—8A;

FIG. 8B illustrates a cross sectional view taken ırough a device such as FIG. 8 but which has been rovided with an alternative coating arrangement 'hich covers the entire planar exterior surfaces of the olarized active movable bender portions of the device;

FIG. 8C is a partial cross sectional view of the device f FIG. 8 taken through that part of the device under ıe clamping means in order to better illustrate how the onformal coating is caused to cover any exposed parts r edges of the active, polarized portions of the piezo- lectric ceramic plate elements;

FIG. 9 is a longitudinal sectional view of an embodi- ıent of the invention similar to that shown in FIG. 8 nd illustrates the manner in which load current carry- ıg contacts can be formed on the free movable bender ortion of the device; and FIGS. 10 and 11 are perspective views of different :chniques employed in order to obtain terminal tabs for pplication of energization potential to or providing electric load current flow through the electrically conductive surfaces formed on the piezoelectric plate elements of the devices shown in FIGS. 8 and 9.

BEST MODE OF PRACTICING INVENTION

Figure 1A:
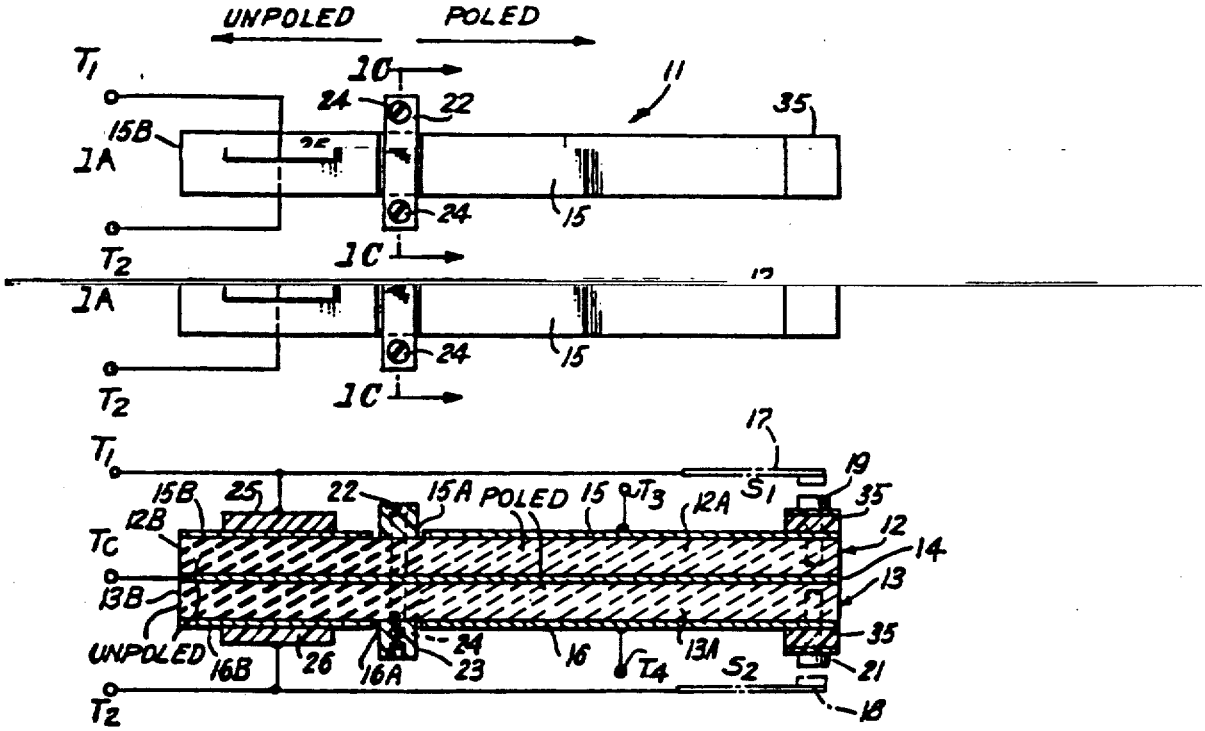
FIG. 1A is a cross sectional view of the device shown in FIG. 1 taken through plane 1A—1A.
Figure 1C:
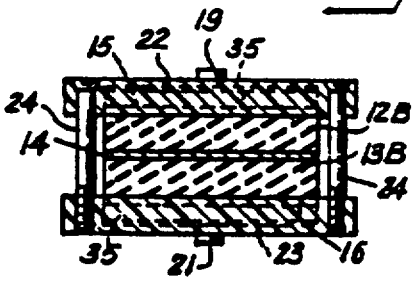
FIG. 1C is a cross sectional view of the device shown in FIG. 1 taken through plane 1C—1C.

FIG. 1 illustrates a piezoelectric switching device constructed according to the invention and comprises at least one piezoelectric bender-type switching device 11 having at least two planar piezoelectric plate elements formed by an upper plate 12 and a lower plate 13 [best] *better* seen in [FIG. 1A] *FIGS. 1A-1F* of the drawings. The piezoelectric ceramic plate elements 12 and 13 are secured in opposed parallel relationship sandwich fashion on opposite sides of at least one central conductive surface 14 and have respective outer conductive surface 15 and 16 that are insulated from each other and the central conductive surface 14 by the respective intervening piezoelectric ceramic plate element thicknesses. The piezoelectric ceramic plates 12 and 13 may be formed from lead zirconate titanate, lead metaniobate, barium titanate or other known piezoelectric ceramic materials and, if desired, could even comprise naturally [occuring] *occurring* piezoelectric materials such as quartz. The conductive surfaces 14, 14A, 14B, 15 and 16 may be formed by nickel, silver or other like [conductor] *conductors* deposited or otherwise secured to the plate elements 12 and 13.

The bender-type piezoelectric switching device further includes at least one set of coacting fixed electrical switch contacts 17 and 18 mounted on relatively rigid support arms which may be sufficiently flexible to absorb impact *and* which are opened and closed by movement of a prepolarized movable bender portion comprised by the piezoelectric ceramic plate elements 12A and 13A of the bender-type switching device. The contacts 17 and 18 coact respectively with contacts 19 and 21 formed on the movable end of the bender device 12A, 13A in a manner to be described more fully hereafter with relation to FIGS. 1D, 1E, and 1F.

The movable bender portions 12A, 13A of the piezoelectric ceramic switching device 11 are physically supported in a cantilever manner by clamping means shown at 22 and 23 which both serve to physically hold and clamp together the piezoelectric ceramic plates 12 and 13 with the central conductive surface 14 sandwiched therebetween. The clamping means 22 and 23 is illustrated better in FIG. 1C of the drawings where it can be seen that it is comprised by two elongated substantially rigid electrically insulating bars 22 and 23 whose ends extend beyond the side edges of the piezoelectric ceramic plate elements 12 and 13. Threaded set screws shown at 24 serve to clamp the two insulating bar members 22 and 23 together along with the interposed ceramic plate elements 12 and 13 and central conductive surface 14. Other forms of suitably clamping and holding the piezoelectric ceramic plate members 12 and 13 together in assembled relation will be suggested to those skilled in the art.

As best shown in FIG. 1A, the clamping means 22 and 23 are disposed over portions 12B and 13B of the piezoelectric ceramic plate elements 12 and 13 which have not been prepolarized and therefore are unpoled and electrically neutral as opposed to the prepolarized active movable bender portions 12A and 13A of the plate elements on which the contacts 19 and 21 are formed. Preferably, the clamping means 22 and 23 are disposed over the ends of the non-polarized or unpoled portions 12B and 13B which are immediately adjacent to and physically integrated with the end of the prepolarized active movable bender portion comprised by plate element portions 12A and 13A which have been prepolarized and therefore are indicated as poled. It has been discovered that by mounting the piezoelectric ceramic plate elements in this manner, the number of failures due to fracturing of the piezoelectric plates at their support points is greatly reduced.

With the bender-type piezoelectric ceramic switching device shown in FIGS. 1 and 1A, it is possible to prepolarize the plate portions 12A and 13A in-situ after fabrication of the device in the manner shown in these drawings. This is achieved by applying suitable value prepolarizing potentials of the same polarity to the terminals T3 and T4 respectively, while concurrently holding the common terminal Tc at the opposite polarity. Simultaneously the temperature of the device may be elevated in an oven or otherwise to a temperature just under the Curie temperature of the piezoelectric ceramic plate elements 12 and 13. The temperature to which the device will be elevated and the value of the prepolarizing potentials will vary dependent upon the particular piezoelectric ceramic material employed to form the plate elements 12 and 13 as is known to those skilled in the art of piezoceramic fabrication. Ambient temperature polarization also is possible if the polarizing potential is sufficiently high. During the prepolarization operation, and in order to separate the piezoelectric ceramic plate elements 12 and 13 into the two separate poled portions, 12 A and 13A and the unpoled portions 12B and 13B, it is necessary to electrically isolate the two portions so that the prepolarizing potential is not applied across the unpoled portions 12B and 13B and the common conductive surface 14. For this purpose, suitable gaps shown at 15A and 16A are deliberately formed across the width of the exterior conductive surfaces 15 and 16, respectively, whereby an electric potential applied between either of the terminals T3 or T4 and the common terminal Tc connected to the central conductive surface 14, will not appear across the piezoceramic plate portions 12B and 13B which are to remain unpoled. It [sould] *should* be noted that the portions of the piezoelectric ceramic plate elements disposed under the clamping bars 22 and 23 have their outer conductive surfaces removed so that the portions 12B and 13B under the clamping means and immediately adjacent and physically integrated with the prepolarized plate portions 12A and 13A remain unpoled and electrically neutral.

As a result of fabrication in this manner, during operation of the bender-type switching device, energizing potentials may be selectively and respectively applied either to terminal T3 or terminal T4 relative to Tc to cause the polarized active movable bender plate portions 12A or 13A to bend and close their respective contacts 19 or 21 on either of the coacting contacts 17 or 18, respectively. As noted in the brief discussion earlier in the specification, prepolarization of the active movable portions 12A and 13A of the piezoelectric ceramic plate elements will leave these portions permanently altered in physical dimensions relative to the unpoled portions 12B and 13B of the piezoelectric ceramic plates 12 and 13. This alteration will be in the form of a permanent increase in dimension of the plate portions 12A and 13A between the poling electrodes 15-14 and 16-14 and also will induce a permanent decrease in dimension parallel to the electrodes (i.e. along the longitudinal dimension of the device as shown in FIG. 1A). When a DC voltage of the same polarity as the prepolarizing voltage, but of smaller magnitude, subsequently is applied as an energizing potential between the poling electrodes, the plate element portions 12A and 13A experience a further temporary expansion in the poling direction and contraction parallel to the electrodes. When the energizing DC potential is removed, this temporary expansion in the poling direction and contraction parallel to the electrode is relaxed, and the plate element portions 12A and 13A return to their normal, at rest unenergized condition established by the prepolarization voltage effects only. This, it will be appreciated that the movable bender plate element portions 12A and 13A automatically return to their original prepolarized dimensions so that the bender moves back to its central, at rest, unenergized condition with contacts 19 and 21 opened when the DC energizing voltage is removed from across the electrodes T3-Tc or T4-Tc.

A key feature of the present invention is the provision of piezoelectric ceramic bender-type switch energization and/or utilization circuit means which are built directly onto an unused portion of the piezoceramic plate elements 12 and 13 of the bender-type piezoelectric ceramic switching device 11 as will be described hereinafter. When thus constructed, circuit stray inductance is reduced to an absolute minimum since circuit interconnecting conductor runs formed on such unused piezoceramic plate portions require only minimum lengths. The energization circuits thus formed serve to supply a direct current energizing potential selectively and respectively to each piezoelectric potential always is poled in the same direction as the prepolarizing electric field previously permanently induced in the piezoelectric plate element portions 12A and 13A whereby no depolarization of the piezoelectric plate element portions occurs during continued or successive operations of the switch to close or open the make and break contacts 17, 19 or 18, 21. It will be appreciated therefore that an improved piezoceramic switching device according to the invention such as that shown in FIGS. 1 and 1A can be operated as either a normally-open or a normally-closed switch without detriment to the long term stability and reliability characteristics of the switch. This is explained as follows.

Assume that the outer conductive surfaces 15 and 16 over [peizoelectric] *piezoelectric* ceramic plate portions 12A and 13A are maintained positive while the central conductive surface of the plate portions 12A and 13A as described briefly above. The prepolarization of these plate elements then will cause a permanent increase in dimension between the poling electrodes and a permanent decrease in dimensions parallel to the electrodes (i.e. the plate portions 12A and 13A will become thicker and shorter). Since both plate element portions 12A and 13A are prepolarized substantially simultaneously, this permanent change in dimension will not effect the centering position of the active movable bender comprised by plate portions 12A, 13A relative to the coacting contacts 17 and 18. However, in the event that some off-centering does occur, then the magnitude of the prepolarizing potential applied across either one or the other of the plate element portions 12A or 13 A can be adjusted so as *to* precisely center the bender contacts 19, 21 between the coacting contacts 17, 18. This ability to precisely center the bender element in an easily applied and readily adjusted manner is attributable to the fact that the bender plate elements !A and 13A can be prepolarized in-situ and is of exeme importance during manufacture in order to assure oper operation of the bender switch at relatively low st since there are fewer fabrications and process steps volved. Thereafter, during operation, DC energizing tential selectively and respectively can be applied ther to terminals T3 or T4 and such energizing potenals always are poled in the same direction as the polary of the prepolarizing potential. Since it was assumed at the prepolarizing potential applied to conductive rfaces 15 and 16 was positive relative to the potential the central conductive surface 14 which therefore is gative relative to 15 and 16, the applied energizing C potential required to operate the switch would have rresponding polarities. That is, DC energizing potenal applied either through T3 or T4 would be positive lative to the potential applied to Tc. This is the proper larity relation where the bender-type switch is degned for use with PNP bipolar transistors or P-type ET transistors. Where the switching circuit is to be sed with NPN bipolar transistors or N-type FET transtors, then the polarities would be reversed both with spect to the high voltage value prepolarizing potential nd the later applied operating energizing potentials so s to preserve the proper dipole enhancement of the repolarized portions of the piezoelectric ceramic plate lements 12A, 13A. That is to say, negative polarity nergizing potentials would be selectively applied to ither terminal T3 or T4 and a positive polarity energizg potential applied to terminal Tc.

As noted earlier, during operation the application of e further DC energizing potential which is of smaller agnitude than the prepolarizing potential, but of the ame polarity, results in a further thickening and shortning of one or the other of the plate element portions 2A or 13A. This thickening and shortening of one of he plates consequently will result in physically bending he free movable end of the active bender portion 12A, 3A sufficiently to selectively close either the contact 9 on its coacting contact 17 (in the event T3 is enerized), or, alternatively, selectively close contact 21 on s coacting contact 18 (if T4 has been energized). The losure thus achieved will remain for so long as the DC nergizing potential is applied to the respective contacts T3 or T4. This can be for an indefinite period of time. Thus the bender-type switching device 11 shown in FIGS. 1 and 1A, by appropriate energization and utiliation circuit design, can be used either as a normallypen or a normally-closed switching device. This capaility is achieved because of three principal characterisics of the switching device. First, the piezoelectric eramic plate elements 12 and 13 essentially are high uality capacitors having little or no losses when harged (energized). Secondly, any losses that do occur ver extended periods of being energized are suplanted immediately and continuously by the continuly applied energization potential. Lastly, because the nergization potential always is applied with the same olarity as the prepolarization potential used to initially repole and enhance the dipole orientation of the piezolectric ceramic plate portions 12A and 13H, there is no possibility of long term depolarizing effects rendering the device unstable in operation.

Upon removal of the DC energizing potential to either T3 or T4, the active movable bender portion 12A, 13A returns to its center neutral unenergized position thereby opening which ever set of contacts 17, 19 or 18, 21 was closed. It should be noted at this point in the description, that prepolarization and subsequent operation with DC energizing potentials of positive polarity applied to the respective outer conductive surfaces 15 and 16 via terminals T3 and T4 while the center conductive surface 14 is maintained negative, is cited as exemplary only. The device could be fabricated and operated equally well with negative polarity prepolarizing potentials applied to the terminals T3 and T4 while the central conductive surface 14 terminal Tc is maintained positive positive. If thus prepolarized, the device of course subsequently would have to be operated using only DC energizing signals applied to the terminals T3 and T4 which are negative relative to the potential applied to the central conductive surface 14 via terminal Tc. FIG. 7B and 7C to be described hereinafter illustrate this capability.

With reference again to FIGS. 1 and 1A, it will be seen that there are two unpoled piezoelectric plate element portions 12B and 13B which extend beyond the clamped portion of the piezoceramic plates 12 and 13 in a direction opposite from the prepoled active movable bender portions 12A, 13A. These unpoled plate element portions 12B and 13B may be provided with exterior conductive surfaces such as shown at 15B and 16B which are separated from the conductive surfaces 15 and 16 overlying the polarized piezoceramic plate portions 12A and 13A by the gaps 15A and 16A under clamping bars 22 and 23, respectively, together with the central conductive surface 14 sandwiched therebetween to form two separate, relatively large (i.e. 1 microfarad) capacitors. In the embodiment of the invention shown in FIG. 1A, the conductive surface 14 extends throughout the length of the piezoceramic plate elements 12 and 13 so that a continuous central electrically conductive path 14 extends between the free movable bender *portions* 12A, 13A of the device and the end thereof connected to the common terminal Tc. If required for particular circuit design purposes, the central conductive path 14 provided through conductive surface 14 may be interrupted along a line under the clamping bars 22 and 23, or at a number of points, and the space therein filled with a suitable insulating adhesive for the purpose of electrically isolating portions of the central conductor 14 under non-poled plate portions 12B and 13B, and/or to electrically isolate the central conductor portion 14 under the prepoled plate [portion] *portions* 12A and 13A from that under non-poled portions 12B, 13B. In either form of construction, the unpoled plate portions 12B and 13B form two capacitors which in effect readily can be connected in either a series or parallel circuit relationship via the central conductor surface 14 thereunder and terminal Tc. The capacitors thus formed by appropriate design and fabrication of the outer conductor surfaces 15B and 16B may be provided with capacitance values required for particular circuit designs. The size of the capacitors and their capacitance values are related to the power rating of the circuit and bender size. For example, up to a capacitance of about a tenth of a microfarad would be provided for switching devices constructed in the manner described having bender member dimensions of about one inch wide by three inches long and with piezoelectric ceramic plate element thicknesses of about 3–10 milli-inches with the conductor surfaces being extremely thin. It should be understood that if a number of different size capacitors are desired in any particular circuit arrangement, they can be formed by appropriate subdividing the outer conductive surfaces 15B or 16B into the desired number and size capacitors. The multiplicity of capacitors thus formed could all use the common central conducting surface 14 as a common electrode via terminal Tc.

In addition to *the* capacitors formed in the above briefly described manner, other electrical circuit components comprising either active semiconductor devices or passive circuit elements fabricated either in discrete, hybrid or monolithic integrated circuit form physically can be formed on or supported by the unpoled piezoelectric plate element portions 12B or 13B. In such devices the conductive surfaces 15B and 16B could be shaped to provide conductive paths (runs) between the various components to interconnect them into desired circuit relationship in accordance with known printed circuit and integrated circuit fabrication techniques as described in the textbook "Microelectronics" edited by Max Fogiel and published by Research and Education Association, copyrighted 1968, and others such as "Handbook of Electronics Packaging", Charles A. Harper, editor, published by McGraw-Hill Book Company and copyrighted 1969 and "Handbook of Components for Electronics", Charles A. Harper, editor, published by McGraw-Hill Book Company, copyrighted 1977.

In FIG. 1A, relatively large hybrid integrated resistors are shown at 25 and 26 which are surface mounted on the respective conductive surface portions 15B and 16B of the unpoled electrically neutral piezoelectric ceramic plate portions 12B and 13B, respectively and may be formed either by surface deposition, bonding or screening. This structure results in two series connected resistor and capacitor elements which are designed to form a snubber circuit connected across the terminals T1-Tc and T2-Tc, respectively. By interconnecting the two snubber capacitances in parallel, the total capacitance of the snubber can be doubled.

FIG. 1B of the drawings is a schematic circuit diagram of the novel piezoelectric ceramic switching device and related energization and utilization circuit shown physically in FIGS. 1 and 1A of the drawings. In FIG. 1B the terminals T1 and T2 are connected to a suitable source of alternating current or direct current of the correct polarity. Terminal T1 is connected through the switch S1 formed by contacts 17 and 19 via the central conductive surface 14 to the common terminal Tc. Terminal T2 is connected through the switch S2 formed by the coating contacts 18 and 21 via central conductive surfaces 14 to common terminal Tc. The snubber circuit formed by the series connected resistor R25 and capacitor C12B is connected in parallel across switch S1 and the snubber circuit formed by the series connected resistor R26 and capacitor C13B is connected in parallel circuit relationship across the switch S2. The snubber circuits R25, C12B and R26, C13B are provided to prevent excessive arcing across the contacts 17, 19 or 18, 21, respectively, as the contacts are opened in order to interrupt current flow through the respective switches and result in reducing the rate of rise of reapplied forward potential across the contacts as they open. The inclusion of the snubber circuit thus provided is referred to as a dv/dt protection circuit for the switch S1 and S2 contacts and can greatly increase their operating life, and reduce electrical noise effects.

User operated energization circuit means are provided for selectively and respectively closing or opening the switches S1 and S2. The energization circuits are comprised by either a negative polarity source of direct current potential or an alternating current source of potential connected in series circuit relationship through a normally open user operated switch 27, a limiting resistor 28, and diode rectifier circuit means 29 across the prepolarized portion 12A or 13A of the piezoelectric ceramic switching device 11 and the common central conducting surface 14 to the common terminal Tc that is connected to the positive polarity terminal of the direct current source or an alternating current source, which ever is used. In preferred embodiments, the normally open user operated switch 27 either is electrically or mechanically interconnected with a normally-closed switch 31 that is connected in series circuit relationship with a limiting resistor 32 with the series circuit thus comprised being connected in parallel circuit relationship across the respective prepolarized upper and lower piezoelectric ceramic plate elements 12A and 13A, respectively, which are indicated as capacitors C12A and C13A. The energization circuit comprised by elements 27–32 have not been illustrated in their physical form in FIGS. 1 and 1A in order not to unduly complicate these drawings; however, it is believed obvious to one of ordinary skill in the electronic art as to how these components would be physically implemented and interconnected to the piezo ceramic switching device 11 shown in FIGS. 1 and 1A in the light of the teachings of this application.

In operation, the normally closed switch contacts 31 will maintain the prepolarized upper and lower piezoelectric ceramic plate elements 12A and 13A in an uncharged condition so that the bender device 11 is maintained at its central neutral position with neither switch S1 or S2 *being* closed. If it is desired to close switch S1 comprised by contacts 17 and 19, for example, in order to supply load current to a load device controlled by switch S1, the user operated, normally open switch contacts 27 are closed. This results in charging the upper piezoelectric ceramic plate element 12A via the limiting resistor 28, diode rectifier circuit means 29 and the source of electric potential connected across the energization circuit input terminal and common terminal Tc. Concurrently with this action, the normally-closed switch contacts 31 automatically open so that piezoelectric ceramic plate element 12A can be charged thereby causing it to physically deform in the manner described earlier and close switch S1 by closing switch 19 on coacting switch contact 17 to provide load current supply to a load (not shown). After a desired period of operation of unlimited duration, and at the user's option, the electrical load current flow being supplied via switch S1 contacts 17, 19 can be interrupted by merely opening the normally-open switch contacts 27 thereby automatically closing normally-closed switch contacts 31 and discharging the piezoelectric ceramic plate element 12A. This results in de-energizing the upper plate element 12 and allows the bender device 11 to return to its normally quiescent, neutral central position whereby neither of the switch contacts S1 or S2 are closed. Operation the device to close the switch S2 comprised by contacts 18 and 21 is entirely similar to that described with relation to the switch S1 so that it need not be described here in detail. Further, it should be noted that reversal of polarity of the excitation voltage supplied to the prepolarized, movable bender plate portions 12A and 13A readily can be accomplished by reversal of the polarity of connection of the diode rectifiers 29 should that be desired for a given utilization circuit application. Additionally, in alternative embodiments of the FIG. 1B circuit, the normally closed [contact] *switch* 31 is eliminated and the resistance value of resistor 32 increased to about ten times the value of resistor 28.

One of the difficulties encountered with bender-type piezoelectric ceramic switching devices of the same general type as that illustrated in FIGS. 1 and 1A of the drawings is a tendency for the movable bender *portions* 12A, 13A at the free movable end thereof to which the contacts 19 and 21 are secured tending to curl during continued energization. As a result of this tendency to curl at the free movable [ends] *end* while being energized, the available contact area for doing work is reduced [and increases] *with increased* heating, the contact force with which the contacts close is reduced and the spacing of the contacts and the timing of their closure cannot be precisely controlled thus rendering the device unstable and unreliable in operation. To avoid this difficulty, the present invention provides a relatively thin inflexible stiffening member 35 secured widthwise across the extreme free movable end of the prepolarized movable bender portions of the respective upper and lower piezoelectric ceramic plate elements 12A and 13A as best seen in FIGS. 1 and 1A of the drawings. The inclusion of the stiffening member 35 assures that the mass of the extreme free end of the bender portion moves as a unit thereby summing the available forces and remains rigidly straight so that it is not allowed to curl or bend during energization [detrimentally] *detrimental* to the operation of the switching device 11. By appropriate design, the mass of the stiffening members 35 can be tailored to cause the overall bender operation to more nearly approach mechanical resonance during movement of the bender portion of the device should this be desired.

Figure 1D:
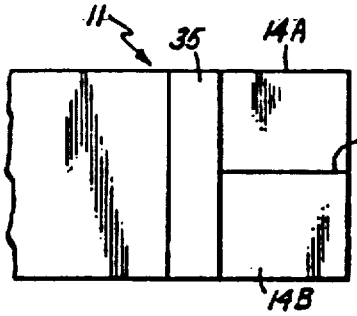
FIG. 1 is a top elevational view of a new and improved piezoelectric ceramic bender-type switching device constructed according to the invention.
FIG. 1B is a schematic circuit diagram of a novel energization circuit employed in operating the switching device of FIG. 1.
FIG. 1E is a perspective end view of the same portion of the device shown in FIG. 1D at [the] *a* moment later in time during the manufacture thereof following the stage shown in FIG. 1D.
FIG. 1F is a partial side end view of the finished device showing the manner of fabrication of the end contacts when viewed in conjunction with FIG. 1D and FIG. 1E.
Figure 1F:
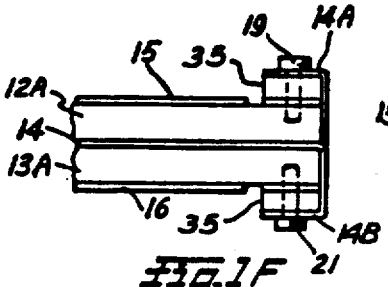
Figure 1E:
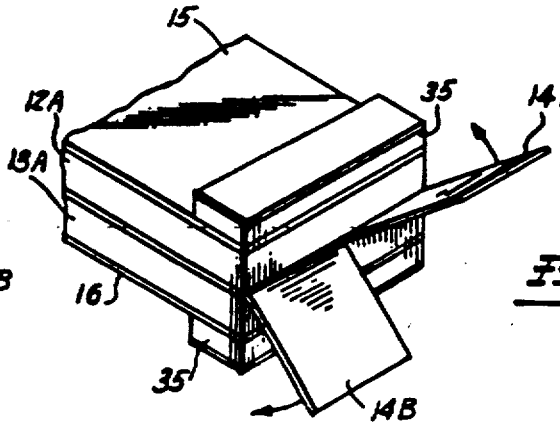

FIGS. 1D, 1E and 1F of the drawings illustrate a preferred form of fabricating the electrical contacts 19 and 21 secured to the free movable ends of the respective piezoelectric ceramic bender plate portions 12A and 13A. As best seen in FIG. 1D, the central conductive surface 14 at the free movable end of the bender device is fabricated in the form of a foil having two halves 14A and 14B separated by a slit 14C cut lengthwise through the extended portion of the conductive foil. As shown in FIG. 1E, the two conductive foil halves 14A and 14B are bent upwardly and downwardly so as to extend over and cover about half of the length of the upper and lower exposed surfaces of the respective stiffening members 35 secured to the ends of the upper and lower piezo ceramic plate element portions 12A and 13A, respectively. The folded over conductive foil portions 14A and 14B then may be extended by additional foil (not shown) along the full lengths of the outer upper and lower surfaces of the stiffening members 35 to provide balance to the bender and then secured to the stiffening members 35 by flat headed conductive rivets 19 or 21, respectively, located centrally on the stiffening member as best seen in FIGS. [1] *1A* and 1F of the drawings. Since the respective conductive foil halves 14A and 14B and their extension together with the flat headed rivets 19 and 21 provide good electrically conductive connections to the central conductive surface 14, the problem of supplying relatively large load current flow through these bender end mounted contacts and down to the anchored end of the bender without unduly dampening movement of the movable bender plate portions 12A, 13A is made possible.

Figure 2:
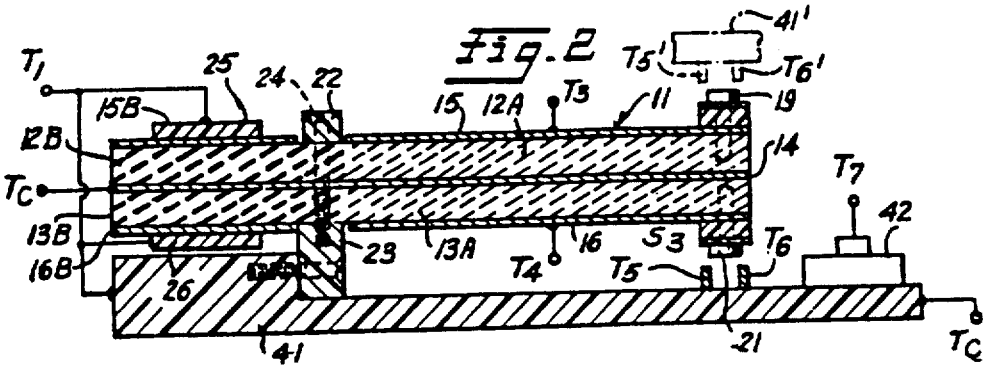
FIG. 2 is a longitudinal sectional view of a different embodiment of improved piezoelectric ceramic switching device constructed in accordance with the invention and illustrates the device mounted on a separate insulating base member.
Figure 2A:
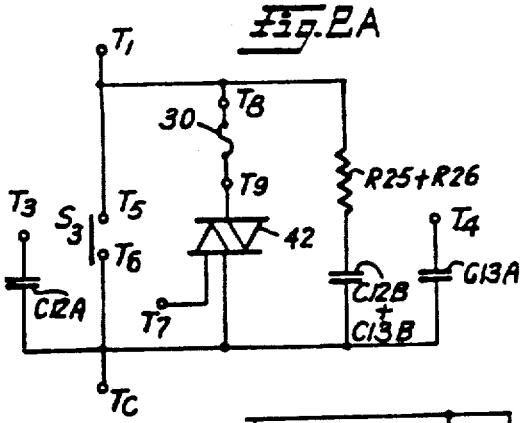
FIG. 2A is a schematic circuit diagram illustrating a utilization circuit controlled by the device of FIG. 2 and which is fabricated on the device.

FIG. 2 is a side elevational view of a second embodiment of an improved piezoelectric ceramic switching device constructed according to the invention. In FIG. 2 is a piezoelectric switching device 11 constructed as described with relation to FIG. 1 is secured to and supported by an insulating base member 41. Base 41 holds switching device 11 with [the] the movable contacts 19 and 21 on the free movable end of bender portions 13A and 12A in juxtaposed switching relationship to sets of fixed contact terminals T5 and T6 mounted on the insulating base member 41 and terminals T5' and T6' mounted on a mirror image of the base member 41' (not shown in full). The insulating base member 41 has a number of conductive runs formed in a known manner on the exposed surfaces thereof for interconnecting the various components of an electrical control circuit including an active power semiconductor device 42 as shown in FIG. 2A of the drawings. The active power semiconductor device 42 preferably comprises a power rated triac such as those manufactured and sold commercially by the General Electric Company Semiconductor Products Department, secured to an extended mounting surface of base member 41 and on which the power semiconductor device 42 is supported together with the conductive runs required to interconnect triac 42 with the several elements of the circuit shown in FIG. 2A.

The piezoceramic switching device 11 of FIG. 2 is constructed and operates in a manner similar to that shown and described with relation to FIGS. 1 and 1A of the drawings with the exception that the extended portions 14A and 14B of the central conductive surface 14 foil are eliminated so that contacts 19 and 21 are electrically isolated from surface 14. In FIG. 2A, only the lower portion of the complete switching device is disclosed since the upper portion of the device would constitute a mirror image of the lower portion and has not been shown for the sake of simplicity. The circuit illustrated in FIG. 2A, including power triac 42, would be controlled by the lower contact 21 of the bender switching device 11 and a similar circuit (not shown) would be controlled by the mirror image portion of the structure shown in FIG. 2 actuated through the upper contact 19 of the bender device. The following description will be with relation to only the illustrated lower portion of the structure and the upper portion would be constructed and operate in a similar manner.

Figure 3:
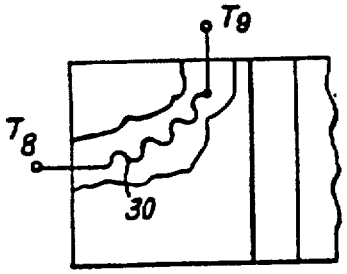
FIG. 3 is a partial top planar view of an unpolarized, electrically neutral end of the bender-type piezoelectric ceramic switching device illustrating an electric fuse element deposited on a portion of such unpolarized piezoelectric ceramic.

In the circuit of FIG. 2A the contact points T5 and T6 which are closed by movable contact 21 on the lower portion of the piezoelectric ceramic bender-type switching device 11 constitute a switch S3 which controls power to an electrical load (not shown) from an alternating current source connected via terminals T1 and Tc and switch S3 in series with the load. The circuit of FIG. 2A constitutes a unique assisted commutation circuit wherein electric current flow through the switch contacts of bender operated switch S3 is interrupted with the assistance of the power triac which is connected in parallel circuit relationship with the switch S3 via a fuse element 30 formed either on the insulating base member or an unpoled portion of one of the piezoelectric ceramic plate elements as shown in FIG. 3. Connected in parallel circuit relationship with the traic 42 are two snubber circuits formed by series connected resistor R25 and capacitor C12B and series connected resistor R26 and capacitor C13B, fabricated and mounted in the manner described with relation to FIGS. 1 and 1A of the drawings, and connected in parallel circuit relationship across each triac 42 and fuse 30. Energization potentials are applied across the respective upper and lower polarized movable bender plate elements 12A and 13A indicated by the [capacitor] *capacitors* C12A and C13A, respectively, via respective energization circuits including user operated switches such as 27, 31 (not shown) similar to those illustrated in FIG. 1B via terminals T3 and T4, respectively.

In operation, a suitable gating signal source (not shown) applied a gating on signal to the traic 42 at a desired point in the phase of the applied alternating current operating potential to be supplied to the load via switch S3. At this point, the traic 42 turns on and carries the load current for only a short period of time before energization of the bender switch 11 results in closure of the switch contacts S3. Closure of the S3 switch contacts under these conditions is substantially without arcing since the potential across the switch during closure has been reduced substantially due to conduction through the triac 42. After closure of the switch contacts S3 by the piezoelectric ceramic switching device 11, conduction through triac 42 terminates due to the shunting of the operating current through the closed contacts T5 and T6 of switch S3. The turn-on signal supplied to triac 42 through terminal T7 by the gating signal source (not shown) then can be removed. Supply of operating current to the load through the closed bender switch contacts S3 then can be maintained for so long as the user desires by maintaining the energizing potential applied to the lower piezoelectric ceramic plate element 13A via energizing signal input terminal T4 in the manner described with relation to the FIG. 1 embodiment of the invention.

When it is desired to interrupt the current flow through the bender switch S2 contacts T5 and T6, the traic 42 again is gated on by the gating signal source (not shown) at any point in the operating cycle of the operating alternating current source before de-energization of the piezoelectric ceramic bender-type [switch] *switching* device 11. Hence as the S3 contacts start to open, current will be diverted from the contacts T5 and T6 and load current flow will take place through the now conducting triac 42. By thus diverting current flow from across the partially open contacts T5, T6 and 21 in this manner, the traic 42 assists commutation off (opening) of the bender switch contacts T5, T6 with little or no arcing taking place. The triac itself then is turned off by removal of its gate turn-on signal at or before the next current zero of the load current supply source. Turn-off of the triac 42 at this point is supported through action of the snubber circuits R25, C12B and R26, C13B which cushion or soften the rate of rise of reapplied voltage across the traic 42 as its turns off to avoid its unintentional turn-on and reconduction resulting from a steep rate of rise of reapplied potential. It will be appreciated therefore that the structure of FIG. 2 provides a fast acting precision synchronous operating relay which allows the power rating of the structure to be greatly enhanced due to the very high surge current rating of the power semiconductor device 42 when operated over such short operating periods, and yet the low on-state resistance of the load current carrying bender operated switch contacts T5-21-T6 of the piezoceramic bender switch device 11 allows the device to be operated indefinitely without substantial heating in its load current carrying condition. Further, the novel switching circuits eliminate the bulk, weight, slow and variable response and heat producing characteristics of traditional electromagnetic relay structures and the stray inductive loops normally encountered with such structures are substantially eliminated [and] *or* reduced to an absolute minimum by the short interconnecting electrical paths formed on the switch component itself. Lastly, it should be understood that polyphase circuit configurations as well as single pole, double throw, center-off systems are within the [teachings] *teaching* of the disclosure indicated by the phantom lines in FIG. 2.

Figure 4:
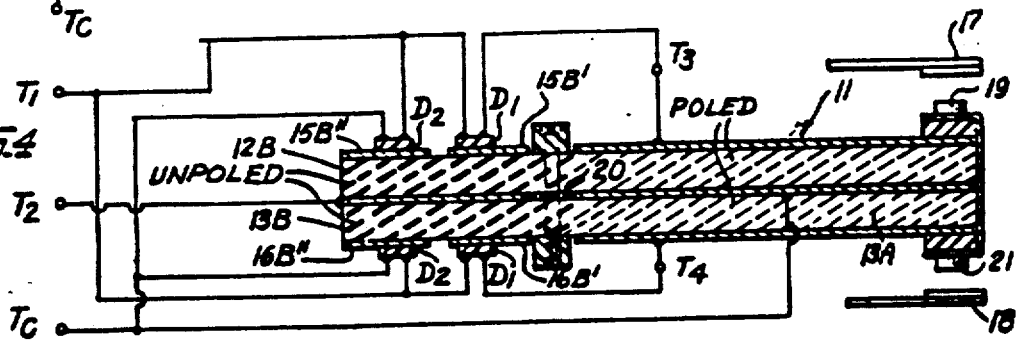
FIG. 4 is a longitudinal sectional view of still a different embodiment of the invention showing active circuit components mounted on a non-polarized portion of a bender-type [switch] *switching* device constructed according to he invention with the active components comprising diode rectifier elements interconnected with discrete wired connectors to effect a desired excitation circuit design for the device shown in FIG. 4.
Figure 4A:
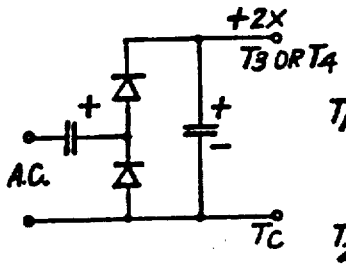
FIGS. 4A, 4B and 4C comprise schematic circuit diagrams of three different embodiments of a diode rectifier doubler circuit configuration suitable for use as as excitation circuit with the piezoelectric ceramic switching device shown in FIG. 4, with a circuit arrangement of FIG. 4B corresponding to the physical illustration of the circuit elements depicted in FIG. 4 and physically supported on unpoled portions of the bender-type switching device.
Figure 4B:
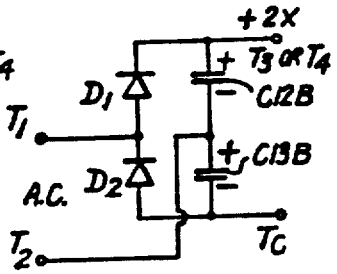
Figure 4C:
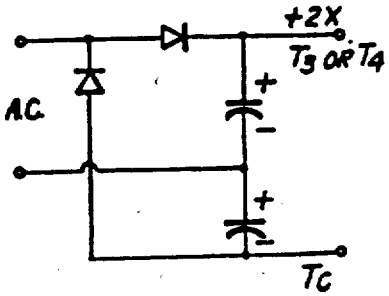

FIG. 4 of the drawings illustrates still another embodiment of the invention intended for use with low voltage energization sources. The embodiment of the invention shown in FIG. 4 is fabricated and operates in substantially the same manner as the FIGS. 1, 1A embodiment with the exception that has voltage doubler circuits formed on the unpoled [portions] *portion* 12B and 13B the piezoelectric ceramic plate elements comprising the bender switching device 11. In FIG. 4, active semiconductor devices in the form of sets of surface mounted semiconductor diodes D1 and D2 are secured on the conductive surface portions 15B', 15B'' and 16B', 16B'', respectively. Each of the conductive surfaces 15B and 16B have been separated into two separate surfaces 15B', 15B'' and 16', 16B'' by a suitable insulating gap in each of the conductive surfaces to form two separate capacitor elements from each of the unpoled piezo ceramic plate portions 12B and 13B thereunder. Additionally, a break in conductive surface 14 is provided at 20 by an insulating land (gap filled adhesive) in the central conductive surface 14. Gap 20 insulates and electrically isolates the portions of conductive surface 14 under the prepolarized portions 12A, 13A from unpoled portions 12B, 13B of the piezoceramic plate elements 12 and 13. The components formed as described above are electrically interconnected by hard wire insulated conductors interconnected in the manner shown in FIG. 4 between the several components to form the electrical circuit illustrated schematically in FIG. 4B of the drawings. A somewhat different arrangement of either the circuit of FIG. 4A or FIG. 4C could be fabricated in a similar manner using discrete or hard wired interconnections or printed conductive paths as described earlier. Each of the circuits shown in FIGS. 4A, 4B and 4C are classical, known diode voltage doubler circuits wherein the value of the AC voltage supplied to the input of the energization circuits for the bender switching device 11 is doubled across their output to terminals T3 and T4, respectively. Thus, if the piezoceramic switching device 11 shown in FIG. 4 has available only say a 115 volt residential alternating current supply with which it is to be used, the switching device shown in FIGS. 4 and 4B could be employed to double the energization potential being applied to input terminals T3 and T4 of the piezoelectric ceramic switching device 11 and still be able to selectively open and close its load current carrying switch contacts 17, 19 and 18, 21 as described earlier with relation to FIGS. 1 and 1A. In other respects, the device operates and is constructed similarly to the switching device shown in FIGS. 1 and 1A of the drawings.

Figure 5:
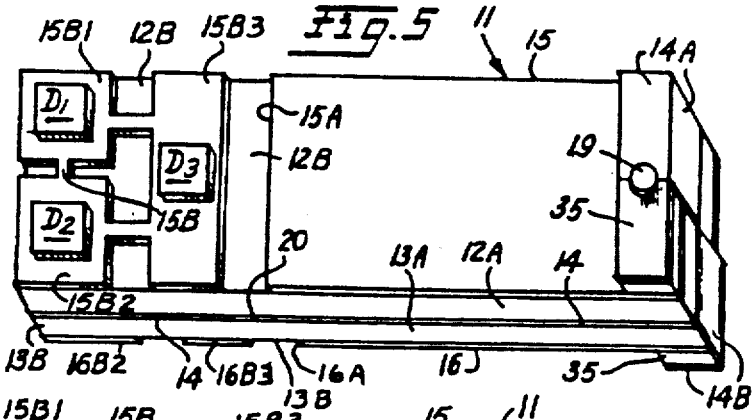
FIG. 5 is a top-side perspective view of a different :om of piezoelectric ceramic switching device con- :tructed in accordance with the invention showing how ıe device would be fabricated for use with a voltage :ipler energization circuit shown schematically in FIG. A of the drawings.

FIG. 5 is a top perspective view of still another embodiment of the invention fabricated in accordance with the techniques and structural features discussed with relation to FIGS. 1–4, and FIG. 5A is a schematic circuit diagram of the energization neutral piezoceramic plate portions 12B and 13B. In FIG. 5 (as well as FIG. 6), the clamping means 22, 23 has been eliminated in order to simplify the illustration, however the gap 15A, 16A in the outer conductive surfaces 15 and 16 is shown clearly. FIG. 5 physically illustrates a printed circuit design for forming a voltage tripler circuit illustrated schematically in FIG. 5A whereby a lower voltage alternating current can be converted to three times its original voltage value for application to the prepolarized piezoceramic bender plate portions 12A and 13A as an energization potential for moving the bender plates.

Figure 5A:
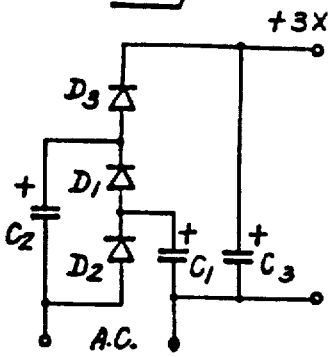
Figure 6:
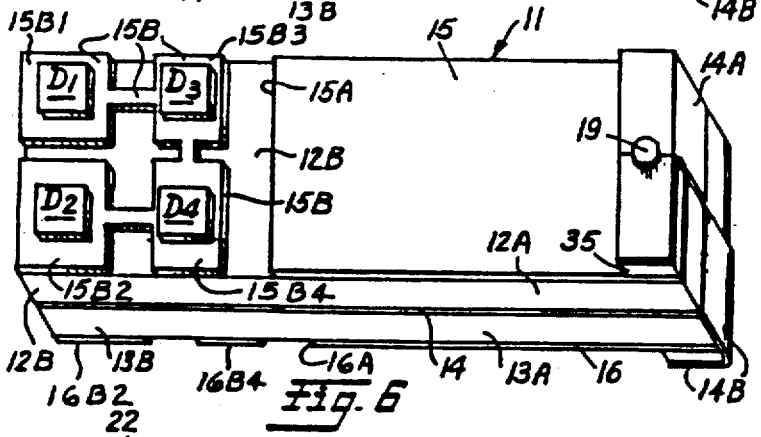
FIG. 6 is top-side elevational-partial perspective view f still another form of switching device according to ıe invention which employs a diode rectifier quadru- ling circuit illustrated schematically in FIG. 6A of the rawings.
Figure 6A:
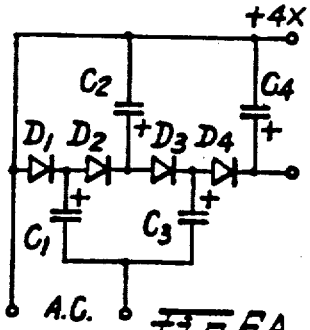

FIG. 6 of the drawings is similar to FIG. 5 but illustrates a piezoelectric ceramic switching device 11 fabricated to provide a voltage quadrupling energization circuit illustrated schematically in FIG. 6A of the drawings formed on each outer surface of the unpoled, electrically neutral piezoceramic plate portions 12B, 13B. The voltage quadrupler circuit of FIG. 6A and the tripler circuit of FIG. 5A are of known construction and operation and therefore need not be described further. It should be noted, however that the capacitors shown in these electrical circuit diagrams correspond in numbering C1, C2, etc., to the numbering of the diodes D1, D2, etc., which are supported on the capacitors as shown in FIGS. 5 and 6. The manner in which the islands of conductive surface 15B on FIG. 6 are formed on the unpoled electrically neutral piezoceramic plate portions 12B and 13B, in the FIG. 5 and FIG. 6 devices is similar to that described with relation to FIG. 1 using known conventional photo-resist screening deposition and etching techniques. In this [manneer] *manner* desired size capacitor neutralized electrodes 15B1, 15B2, [and] 15B3, *etc.* in FIG. 5 in 15B1, 15B2, 15B3 [and]. 15B4, *etc. in FIG. 6* are formed together with the appropriate size interconnecting conductive runs between the several electrodes. Semiconductor diodes D1-D3 in FIG. 5 or D1-D4 in FIG. 6 are supported on the respective [metalized] *metallized* electrode surfaces. A practical way to implement the FIG. 5 and FIG. 6 devices would be to employ discrete semiconductor diode devices prepared for surface mounting directly to the conductive surfaced of the metallized electrodes 15B1, [15B2] *16B1*, etc. by soldering, ultrasonic bonding techniques and/or by a suitable conductive adhesive or the like. These fabrication steps will have been carried out are prepolarization of the active, movable prepolarized portions 12A, 13A of the piezoelectric ceramic bender-type device to prevent possible damage to the components by the high prepolarizing potential. Alternatively, the capacitor electrode areas 15B1, [15B2] *16B1*, etc. and diodes D1-D3 or D1-D4 could be formed by integrated circuit fabrication techniques such as those described in the above referenced textbook entitled "Microelectronics" by Max Fogiel published by Research Education Associates of New York, N.Y., copyrighted 1968. Similar techniques could of course be employed in forming corresponding capacitor electrodes and conductive runs employed in the FIGS. 1, 1A and FIG. 2 embodiments of the invention described earlier.

Figure 7:
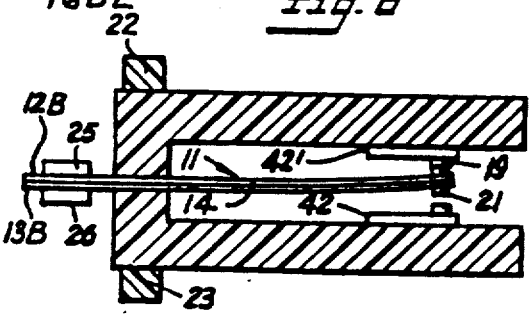
FIG. 7 is a side elevational view of still another form f improved piezoelectric ceramic bender-type switch- ıg device according to the invention to provide H-type ouble acting switching operations on each of the oppo- te sides of the neutral position of the bender element of ıe device.
Figure 7A:
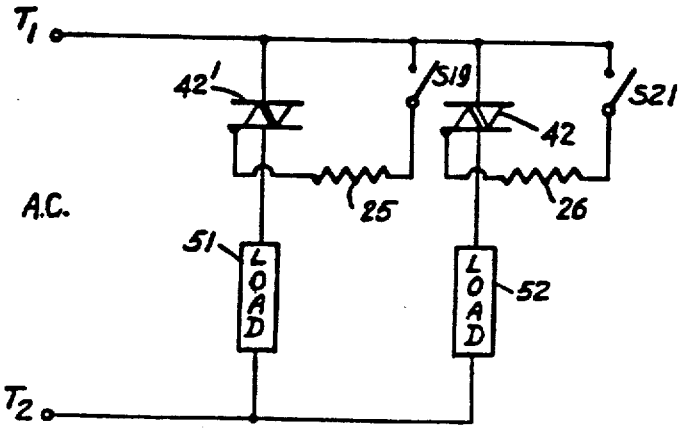
FIG. 7A is a schematic circuit diagram of one em- odiment of a utilization load circuit which could be perated with the device of FIG. 7.

FIGS. 7 and 7A of the drawings illustrate still another embodiment of the invention wherein a piezoceramic bender switching device 11 is employed to close a circuit selectively either through switch contact 19 or switch contact 21 to supply a gating-on signal current to the control gate of a respective associated gated power switch such as an SCR, power transistor or triac 42, 42' as illustrated in FIG. 7A. Conductive runs are formed out of the portion of the interior conductive surface 14 of the bender switching device 11 to provide electrical interconnections to limiting resistors 25 and 26 formed on the unpoled electrically neutral portions 12B and 13B of the bender device as described with relation to the FIGS. 1, 1A embodiment of the invention. The current limiting resistors 25 and 26 are connected intermediate the piezoceramic bender switch contacts 19 and 21, respectively, and the control gates of the respective traic devices 42, 42' associated with the respective bender actuated switch contacts 19 and 21.

In operation, turn-on of either one or the other of the gate controlled power switching devices 42, 42' is achieved by energizing the appropriate prepolarized piezoceramic plate element of switching device 11 to cause either contact 19 or contact 21 to close on the gate input terminal of its associated power triac 42 *or 42'*. The stored electrical charge in the prepolarized piezoelectric plate element then discharges into the gate of the traic and provides adequate turn-on current to the triac to cause it to turn-on and conduct current. Upon turn-on of the triac 42 or 42', either load 51 or load 52 will be supplied with alternating current load current via the associated conducting power triac switch 42. Turn-off of the associated conducting triac power switch 42 is achieved by merely de-energizing the respective previously energized prepolarized, active movable piezoceramic plate portion (either 12A or 13A) of the bender switch device 11 at an appropriate point in the cycle of the supply alternating current. If desired, suitable snubbing circuits as described with relation to FIG. 1B may be provided across the associated gate controlled power switching devices 42, *42'* to assist these devices in withstanding the reapplied forward load voltage after turn-off by suitable fabrication of the switching device 11 shown in FIG. 7 as described earlier with respect to FIG. 1.

FIG. 7B illustrates an alternative form of power circuit gating arrangement using a novel piezoceramic bender-type switch 11 constructed according to the invention and wherein the electric energy stored in the piezoceramic plate elements of the bender-type switch 11 is employed as a source of gating current for a gated power semiconductor switch such as an SCR, power transistor or triac 42 supplying a load 51 or 52 as shown in FIG. 7B. The circuit arrangement of FIG. 7B is for use with those types of gated power semiconductor switches which require a positive polarity turn-on gating current supplied to the gate measured relative to the cathode polarity. In this arrangement, an energization circuit [comprised by] *includes* a diode rectifier 29P having its anode connected to the positive terminal of a direct current supply or an alternating current supply. The cathode of diode 29P is connected through a limiting resistor 28 across a set of normally open contacts of either one of a set of normally-open user operated switches 27A or 27B to the outer conductive surfaces 15 or 16 of the prepolarized active movable piezoelectric ceramic plate elements 12A or [12B] *13A* of bender device 11. The outer conductive surfaces 15 or 16 are not excited normally and are shorted to the negative terminal of the DC or AC supply by the normally-closed contacts of either one of normally-closed switches 31A or 31B. The two sets of switches 27 and 31 are either electrically or mechanically interconnected so that when 27 is open, 31 is closed and vice versa. The bender actuated contacts 19 and 21 on the free movable bender end of device 11 [is] *are* designed to close on a coacting contact which is connected through either limiting resistor 25 or 26 to the gated power semiconductor switch device 42' or 42 supplying either load 51 or 52.

In operation, upon closure of the normally, open contacts 27A (for example) by a user of the circuit, the piezoelectric ceramic plate element 12A of bender switching device 11 will be charged via rectifier 29P, limiting resistor 28 and the closed contacts of normally open switch 27A. Normally closed switch 31A automatically will have opened so that charging of the plate element 12A is made possible. In the short time which is required to charge plate element 12A sufficiently to cause bender device 11 to close contact 19 on its coacting fixed contact connected through resistor 25 to the gate of the gated power switch 42', sufficient electrical energy will have been stored in the piezoelectric ceramic plate element 12A to supply adequate gate current to turn-on the gated power switching device 42'. This gate turn-on current is supplied via contact 19 which has been modified to have its contact surface connected to the outer conductive surface 15 of piezoelectric ceramic plate element 12A as opposed to the inner conductive surface 14. The modification to the contacts 19 as well as 21 to provide such connection is believed obvious in the light of the teachings of FIG. 1B, FIGS. 1E and 1F. The gate turn-on current thus supplied to the gate of power switch 42' will be adequate to gate on the semiconductor power switch 42' and maintain it conducting for so long as the user operated switch 27A is maintained closed on its contacts and load 51 will be supplied with the load current via the conducting gated power semiconductor switch device 42'. If it is desired to turn-on the opposite gated power switch 42 supplying the load 52, the normally open switch 27A supplying piezo ceramic plate element 12A is returned to its normally-open condition and the opposite normally open switch 27B supplying piezo ceramic plate element 13A is closed to thereby turn-on the gated power switch 42 supplying load 52 in the same manner described with relation to excitation of load 51.

FIG. 7C of the drawings shows an oppositely poled connection of the bender switch device 11 so that it is arranged to provide negative polarity gate turn-off signals to the control gate if certain types of gated semiconductor power switches 42 *or 42'* which are designed to provide turn-off of the load current supplied through either the load 51 or 52 by means of a negative polarity gate turn-off signal applied to its gate. For these types of devices, it is anticipated that two separate energization (de-energization) circuits will be provided, one such as FIG. 7B supplying a positive polarity gate turn-on signal to the gate for turn-on purposes, and the other supplying a negative polarity gate turn-off signal with the circuit arrangement shown in FIG. 7C to effect turn-off of the load current.

FIG. 8, FIG. 8A, FIG. 8B, FIG. 8C and FIG. 9 all illustrate still further embodiments of the invention wherein two separate central conductive surfaces 14U and 14L are employed in place of a single central conductive surface 14 as shown in the embodiment of the invention heretofore described. In FIG. 8, the two central conductive surfaces 14U and 14L extend throughout the full length of the piezoelectric ceramic plate elements 12 and 13 over the surfaces of both the prepolarized portions 12A and 13A as well as the unpoled electrically neutral portions 12B and 13B. To form the contacts 19 and 21 on the active movable prepolarized end portions 12A and 13A, the entire width of the central conductive surface 14U is folded up and over the inflexible stiffening member 35, secured widthwise across the upper surface of the free end of the bender member 12A and centrally riveted in a manner similar to that shown and described with relation to FIGS. 1B, 1E and 1F. The difference in the FIGS. 1-7 embodiments being primarily that the single central conductive surface 14 of FIG. 1 has its extended portions 14A and 14B cut by a slit with one half being folded up and over and the other half being folded down and over. In the case of the FIG. 8 and FIG. 9 embodiments, the central conductive surfaces 14U and 14L do not have to be split but instead have the entire width of the extended portion of the surface 14UA folded up and over the rigid insulating stiffening member 35 and secured by a central flat headed rivet 19 in the manner shown. In the case of the lower conductive surface 14L its extended portion 14L has its entire width folded down and over the insulating stiffening member 35 and secured by the flat headed rivet 21 in the manner shown.

The two central conductive surfaces 14U and 14L are secured rigidly to an exposed lower surface of the entire [piezelectric] *piezoelectric* ceramic plate member 12 and exposed upper surface of the lower piezoelectric ceramic plate member 13 with the two central conductive surface 14U and 14L being secured together to form the bender device 11 by a thin adhesive layer 61. In preferred forms of the FIG. 8 embodiments of the invention, the adhesive layer 61 will be insulating so that the respective inner conductive surfaces 14U and 14L can be maintained at different electric potentials during energization of the bender switch device 11 to cause it to bend in one direction or the other. In other forms, it may be desirable to use an electrically conductive adhesive 61 to secure the two plate elements 12 and 13 together in order that both inner conductive surfaces 14U and 14L are maintained at the same electric potential. The adhesives employed for this purpose and used in any of the embodiments of the invention described in this application are of the type that can take any high temperature that might be required during in-situ prepolarization treatment as described earlier or in bake-out of vacuum mounted devices without undue out gassing. Typical adhesive systems which could be used for all of the embodiments of the invention herein disclosed include GEMID (imide ether), or ULTEM [(polyetheramide)] (*polyetherimide*). Such adhesives normally are insulating in nature but that conductive granules of a very fine nature may be added to an adhesive layer such as 61 in order to make it suitably conductive where it is desired that the two inner conductive surfaces 14U and 14L be maintained at the same electric potential during operation. However, it is important that the adhesive layer 61 be pinhole free so that in such situations it may be more advisable to interconnect surfaces 14U and 14L externally of the bender member.

Known bender piezoelectric ceramics such as those listed earlier in this application are of such high density that they will provide long service life if correctly formulated, cast and fired. In the present invention it is proposed to extend the operating life of such piezoelectric ceramic bender members through the use of selective electrode formations so as to provide longer creepage paths to avoid surface breakdown [and] *with* the use of a variety of passivating protective coatings and adhesives such as those listed in the previous paragraphs. The embodiment of the invention shown in FIG. 8 of the drawings illustrates the use of a passivating protective coating 62 formed over the exterior (particularly the exterior side) surfaces of the prepolarized, active movable bender portions 12A and 13A of the piezoelectric ceramic bender device 11. The preferred passivating protective coating 62 is a polyimide siloxane copolymer which forms an excellent thin pinhole-free conformal surface passivating protective coating in that it readily flexes to allow movement of the bender device without undue damping effects and is substantially pinhole free. The combination of the selective bender prepoling to provide a separate movable prepolarized bender portion 12A, 13A different from the unpoled clamped portion 12B, 13B together with properly shaped surfaces 14U, 14L, 15 and 16 to recess their edges back away from the side edges of the prepolarized piezoceramic plate elements 12A, 13A as best shown in FIGS. 8A and 8B and a properly composed and applied passivating protective coating to provide a pinhole-free protective surface which encompasses all of the active (movable) areas of the bender while not being subjected to the sharp bending action that takes place at the clamped end of the piezo ceramic bender, provides the utmost in stability, repeatability of operation, and voltage withstand capability together with good service longevity in a piezo ceramic bender-type switching device. These features also allow the use of much higher prepolarization potentials than were possible with previously known bender switching devices and hence result in piezoceramic bender-type switching devices capable of greater work output than previously known devices of comparable size.

Figure 8D:
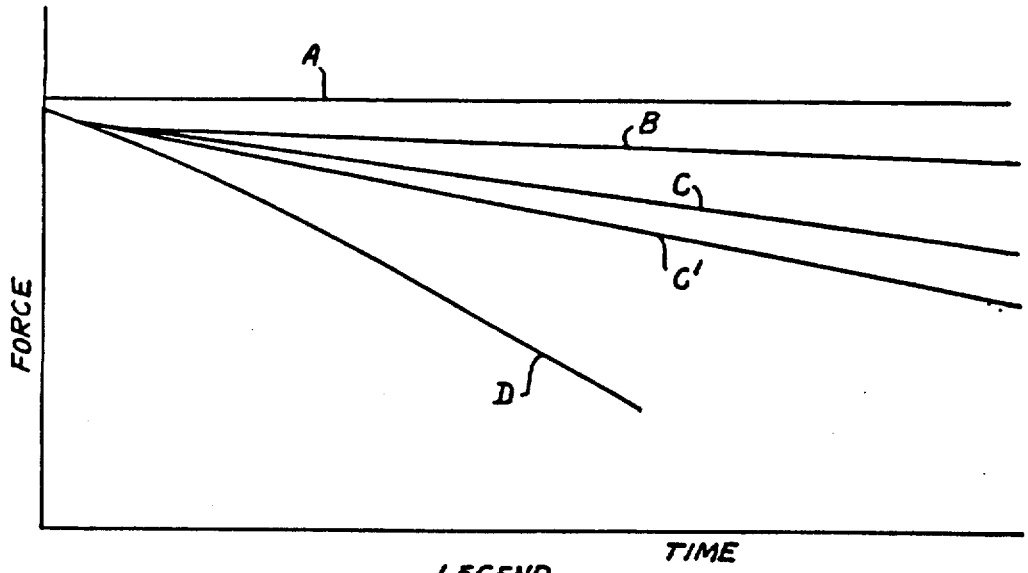
FIG. 8D shows a number of characteristic curves lotting bender force versus time and illustrates the perating characteristics of a number of different piezo- lectric ceramic bender-type switching devices con- :tructed according to the prior art with or without some ›rm of protective coating as well as the operating char- cteristics of preferred forms of the invention illustrat- ıg their force versus time operating characteristics ver a period of time.

With reference to FIG. 8D, a number of curves A–D are shown wherein the characteristics of a number of different piezoelectric ceramic bender-type devices are shown. In FIG. 8D, the bending force developed by the bender device is plotted as the ordinate and time as the abcissa. Curve A shows that the force versus time characteristics of a piezoceramic switching device fabricated as described in this application and then mounted in a properly baked-out vacuum or gas sealed enclosure, provides substantially constant bending force over an indefinite period of time. A piezoceramic bender-type switching device according to the invention having a pinhole-free passivating protective coating of polyimide siloxane copolymer fabricated as described above with relation to FIGS. 8 and 9 and operated in air will have essentially constant force that drops slowly with time as shown in curve B as energization charge bleeds from the piezoceramic bender plate element capacitor. In contrast, a prior art protectively coated piezoelectric ceramic bender switch device bender [for] *exhibits* a force versus time operating characteristic [is] *as* shown in curve C under conditions where the device is operated in air with low humidity. Curve C' illustrates force-time characteristics of the same prior art device operated under high humidity conditions. From Curve C' it can be seen that the bender force of the protectively coated prior art device drops off drastically with time while thus operated under high humidity conditions. Curve D illustrates the force versus time characteristics of known prior art piezo ceramic bender devices which are provided with no protective coating. From these curves it will be appreciated that significant bender force changes can occur if the impedance of the piezo ceramic bender is not maintained at a high value so that leakage current across and around the piezoceramic cannot increase with time or increasing humidity thereby reducing the ability to apply high energization voltage and obtain stability of operation of the device in service.

FIGS. 8A, 8B, and 8C all illustrate fabrication techniques whereby the sealing effects of the passivating protective coating 62 can be improved and a force-time operating characteristic curve such as that shown in B in FIG. 8, or nearly approaching the idealized curve A, can be obtained. In FIG. 8A, a particular coating is provided as shown at 62 which extends to a considerable depth over the exposed side edges of the prepolarized, movable bender plate element portions 12A and 13A and may or may not leave exposed or only thinly cover the central planar areas of the outer conductive surfaces 15 and 16. In this embodiment, the outer side edges of the inner conductive surfaces 14U and 14L are shown as being shortened widthwise so that a considerable portion of the passivating protective coating projects into the space and covers area which otherwise might be occupied by the exposed side edge portions of the inner conductive surfaces. Experience has shown that when current creepage and voltage breakdown occur, it is normally at the side edges between the upper and inner conductive surfaces. To avoid such voltage breakdown and current creepage while the devices are under excitation, fabrication as shown in FIG. 8A is provided. Needless to say, if only a single central conductive surface 14 is used as in the embodiment of the invention shown in FIG. 1, for example, similar techniques would be used in avoiding undue current leakage between the side edges.

FIG. 8B of the drawings illustrates an embodiment of the invention wherein the entire prepolarized movable bender portion 12A, 13A, the side edges thereof, and their associated inner and outer conductive surfaces 15 and 16 are completely enclosed and encompassed by the passivating protective coating 62. In addition FIG. 8B [shown] *shows* the manner in which different side tabs shown at 63 and 64 can be brought out from the bender device package for use as terminal connections to the inner conductive surfaces 14U and 14L, respectively. In the event that the adhesive system used to bond the bender together in a unitary structure is insulating in nature, then it will be appreciated that the upper and lower inner conductive members 14U and 14L can be maintained at separate potentials. Alternately, if the bonding adhesive is conducting in nature, either terminal 63 or 64 could be employed as an output terminal for the device or otherwise.

FIG. 10 of the drawings illustrates an embodiment of the invention wherein the side tab terminals 63 and 64 are placed at different locations along the longitudinal axis of the bender switching device. FIG. 10 illustrates a device having only a single, common conductive surface 14 which has been separated into two parts by an insulating gap shown at 71 longitudinally aligned under the gaps 15A and 16A in the outer conductive surfaces 15 and 16 where the bender device is clamped by a suitable clamping means (not shown). With this arrangement it will be appreciated that side tab 63 provides terminal access to the portion of the central conductive surface 14 disposed under the prepolarized movable active bender portions 12A, 13A of the piezoelectric ceramic switching device and the side tab 64 provides access to the central conductive surface portion 14 under the unpoled portions 12B and 13B of the piezoceramic plate members of the device.

FIG. 8C is a partial sectional view through a piezo ceramic bender device constructed according to FIGS. 8, 8A and 8B but which has been exaggerated somewhat in order to clearly illustrate the extent to which one should go in assuring that the conformal passivating protective coating 62 [extend] *extends* down into and [cover] *covers* any exposed surfaces of the prepolarized piezo ceramic plate elements 12A or 13A as shown at 62A. It is this type of area made, for example, by formation of the gaps 15A and 16A in the outer conductive surfaces 15 and 16 during fabrication in order to accommodate the clamping members 22, 23 where current creepage and voltage breakdown can occur particularly between the exposed cut, etched or otherwise formed side edges of the outer conductive surfaces. To insure against such [undersirable] *undesirable* effects, particular care must be taken to see that the conformal passivating protective coating 62 (as shown at 62A) extends over and covers the outer planar exposed conductive surfaces and their side edges of the prepoled movable bender portion of the device, the side edges of the prepoled planar piezoelectric plate elements, the recessed side edges of the central conductive surface or surfaces sandwiched therebetween and down to and cover any portions of the prepolarized piezoelectric ceramic plate elements exposed by the removal of the outer conductive surfaces 15 and 16 as well as the edge portions of the recessed selectively metallized outer conductive surfaces exposed by such removal.

FIG. 9 illustrates another embodiment of the invention illustrating a different area of the piezoceramic bender device 11 where the prospect of voltage breakdown and current leakage is quite high and with respect to which caution and care should be taken to assure proper fabrication of the device. This area is at the free movable end of the switching device where the outer conductive surfaces 15 and 16 extend up to or near the elongated insulating stiffening members 35 over which the contacts 19 and 21 are formed in conjunction with the portion 14UA and 14LB of the inner conductive surface. At these intersections, it is desirable to remove by cutting, etching or otherwise the portion of the conductive surfaces 15 and 16 abutting stiffening members 35 and filling the spaces thus formed with additional passivating protective coating 62B.

The embodiment of the invention shown in FIG. 9 further illustrates a bender device 11 wherein the portions of the central conductive surfaces 14U and 14L underlying the prepoled and unpoled portions of the device are electrically isolated from each other by an insulating segment of adhesive 72 in the area underlying the clamping means 22-23. As a consequence, that portion of the central conductive surfaces 14U and 14L underlying the prepolarized piezo ceramic plate element portions 12A and 13A will be electrically isolated from the portion of the central conductors underlying the unpoled piezoceramic plate element portions 12B and 13B.

FIG. 11 is a partial perspective view similar to FIG. 10 of the unpoled plate portion of a piezoelectric ceramic bender-type switching device according to the invention, and illustrates still different techniques of construction for providing terminal tabs with which to make electrical connection to either of the inner conductive surfaces 14U or 14L of a device such as that illustrated in FIGS. 8 and 9 of the drawings. As shown in FIG. 11, one corner of each of the upper and lower unpoled piezo ceramic plate element portions 12B and 13B, respectively is ground away so as to expose for access the underlying inner conductive surface 14U secured to the upper plate element portion 12B and the overlying conductive surface portion 14L secured to the lower plate portion 13B. The exposed conductive surfaces thus obtained then may have hard wire connectors or other terminal tabs secured to their surface for application of electric potentials and currents therethrough. For those devices which have only a single central conductive surface 14 or alternatively where the two separate central conductive surfaces 14U and 14L are electrically interconnected by reason of the use of an electrically conductive adhesive, a central tab shown at 65 may be provided at the end of the structure in order to obtain electrical connection to the central conducting surfaces.

As noted earlier in the specification, it is anticipated that complete piezoelectric ceramic bender-type switching devices 11 will be completely fabricated with most if not all of the above-listed and discussed features prior to polarization of the active movable polarized piezoceramic plate portions of the device. Prepolarization in-situ after completion of the device rather than an earlier prepolarization in oil as is normally used with prior art piezo ceramic plate elements is necessary in order to assure good stability of the device in operation. In the absence of an assured 100% dense piezoceramic material, sealing prior ti prepolarization is desirable if not essential in order to avoid any possible permeation or breakdown of the piezoceramic plate elements during the high voltage prepolarization operation. However, it should be noted that the degree of hermetic packaging provided in the manner described above necessarily will depend upon the degree of absolute stability required for each switching device application. Thus, for certain switching devices, absolute hermetic packaging (or an attempt at such packaging) may not be required due to more relaxed operating specifications for the device. Further, the selective electroding and shaping of conductive surfaces 15, 16, 14 or 14U, 14L provides for increased protection against voltage creepage around side edges and operating stress ends and also reduces potential life-cycle problems which might otherwise limit performance of the piezo ceramic bender-type devices resulting from microscopic edge cracking that otherwise [are] *is* produced if conventional cutting and fabrication processing techniques are used.

From the foregoing description, it will be appreciated that the invention provides improved piezoelectric ceramic switching devices together with improved fabrication techniques for such devices as well as novel energization and utilization electrical circuits for the energization as well as use of such improved piezoceramic switching devices. The improved structure provides for the inclusion of parts of either the energization circuit or utilization circuits or both which are physically mounted on and supported by non-prepoled portions of the piezoelectric ceramic plates which comprise the piezoceramic switching devices. By such fabrication, the size, weight and bulk of the switching devices is greatly reduced so that their compactness and [usefullness] *usefulness* with [minaturized] *miniaturized* circuit component improved. Further, because the circuit components with which the devices themselves, stray circuit inductance is greatly reduced thereby improving the circuit noise immunity characteristics during operation of the devices.

The piezoelectric ceramic switching devices fabricated in accordance with the invention are of greatly improved construction and operating characteristics than the comparable prior art devices of the same general nature. The improved piezoceramic switching devices consequently operate with greater stability, reliability and longevity in service over extended periods of operation requiring substantial numbers of switching operations.

INDUSTRIAL APPLICABILITY

Improved piezoelectric ceramic switching devices and systems having the features of construction made available by the invention are useful in a wide number of residential, commercial and heavy industrial electrical systems for use as switching devices in controlling current flow to widely different types of electrical loads having different power ratings. Because of their novel construction, the devices are of lighter weight, less bulk and lower cost than comparable electromagnetically operated switching devices currently being used and have much faster response times.

Having described several embodiments of new and improved piezoelectric ceramic switching devices and systems using the same and their methods of manufacture in accordance with the invention, it is believed obvious that other modifications and variations of the invention will be suggested to those skilled in the art in the light of the above teachings. It is therefore to be understood that changes may be made in the particular embodiments of the invention described which are within the full intended scope of the invention as defined by the appended claims.

What is claimed is:

1. A piezoelectric ceramic switching device including in combination at least one piezoelectric ceramic bender-type switching device having a movable piezoceramic bender member comprised by at least two planar selectively prepoled piezoelectric plate elements secured in opposed parallel relationship sandwich fashion on opposite sides of at least one central conductive surface and having respective outer conductive surfaces that are insulated from each other and the central conductive surface by the respective intervening piezoelectric plate element thicknesses, said bender-type piezoelectric switching device further including at least one set of coacting electrical switch contacts opened and closed by the prepolarized movable bender member of the piezoelectric ceramic switching device, and clamping means securing a different non-poled portion of the piezoelectric ceramic plate elements adjacent to and mechanically supporting the selectively prepoled movable bender member portion in a cantilever manner for opening and closing the set of coacting electrical contacts, the different non-poled portions of the piezoelectric ceramic plate elements disposed under said clamping means remaining non-movable as being mechanically unstrained and electrically neutral, wherein the unpoled piezoelectric plate element portions extend beyond the clamped portion thereof in a direction opposite from the prepoled movable piezoelectric plate element portions between the respective outer conductive surfaces and the central conductive surface form capacitors having any desired capacitance value in the range of tenths of a microfarad and greater dependent upon power rating and usable as circuit components in an electrical circuit for controlling operation of the piezoelectric bender-type switching device or otherwise.

2. A piezoelectric ceramic switching device according to claim 1 wherein the piezoelectric ceramic plate elements disposed under said clamping means have the outer conductive surfaces thereof removed from the portion disposed under the clamping means and wherein said central and outer conductive surfaces are selectively formed following fabrication of the planar piezoelectric plate elements to desired size with the side edges of the conductive surfaces being recessed relative to the side edges of the piezoelectric ceramic plate elements to thereby provide increased voltage stress withstandability around the side edges of the piezoceramic bender member, and which further includes a conformal electrically insulating coating that extends over and covers the outer planar conductive surfaces and their edges of the prepoled planar piezoelectric ceramic plate elements, and further extends over and covers the side edges of the piezoelectric plate elements and the central conductive surface sandwiched therebetween at least over the prepolarized portions of the device and wherein the conformal insulating coating covering the outer planar conductive surfaces of the prepoled portions of the piezoelectric plate elements also extends down to and covers the portions of the piezoelectric plate elements exposed by the removal of the outer conductive surfaces thereon as well as the edge portions of the outer conductive surfaces exposed by such removal.

3. A piezoelectric ceramic switching device according to claim 2 further including additional electrical circuit components comprising either active semiconductor devices or passive circuit elements or both fabricated either in discrete, hybrid or monolithic integrated circuit form physically formed on and/or supported by the unpoled piezoelectric plate element portions extending beyond the clamping means and also including preformed conductive pathways selectively formed by appropriate fabrication of the conductive surfaces on the unpoled piezoelectric plate element portions to interconnect the active devices and/or passive circuit elements including any capacitors formed according to claim [2] *1* in a desired circuit relationship.

4. A piezoelectric ceramic switching [devices] *device* according to claim [3] *1* further including additional electrical circuit components comprising either active semiconductor devices or passive circuit elements or both fabricated either in discrete, hybrid or monolithic integrated circuit form physically formed on and/or supported by the unpoled piezoelectric plate element portions extending beyond the clamping means and also including preformed conductive pathways selectively formed by appropriate fabrication of the conductive surfaces on the unpoled piezoelectric plate element portions to interconnect the active devices and/or passive circuit elements including any capacitors formed according to claim 2 in a desired circuit relationship.

5. A piezoelectric ceramic switching device according to either of claims [3] *1* or [4] *2* further including a relatively thin flexible stiffening member secured widthwise across the free movable end of the prepoled movable bender portion of the bender-type piezoelectric switching device.

6. A piezoelectric ceramic switching device according to claim [5] *1* further including a relatively thin inflexible stiffening member secured widthwise across the free movable end of the prepoled movable bender portion of [the] *a* bimorph piezoelectric switching device.

7. A piezoelectric ceramic switching device according to claim [6] *1* further including an extended length of a portion of the central conductive surface in the form of a conductive foil which is bent back over the top of [the] *a* stiffening member and secured thereto to form an exposed electrical contact electrically and physically connected to the central conductive surface for coacting with an opposed electrical contact to close or open an electrical circuit therethrough upon energization of the piezoelectric ceramic switching device.

8. A piezoelectric ceramic switching device according to claim 5 further including a relatively thin inflexible insulating stiffening member secured widthwise across the free movable end of the prepoled movable bender portion of the bender-type piezoelectric switching device and wherein an extended length of a portion of the central conductive surface in the form of a conductive foil is bent back over the top of the stiffening member and secured thereto to form an exposed electrical contact electrically and physically connected to the central conductive surface for coacting with an opposed electrical contact to close or open an electrical circuit therethrough upon energization of the piezoelectric ceramic switching device.

9. A piezoelectric ceramic switching device including in combination at least one piezoelectric ceramic bender-type switching device having a movable piezoceramic bender member comprised by at least two planar selectively prepoled piezoelectric plate elements secured in opposed parallel relationship sandwich fashion on opposite sides of at least one central conductive surface and having respective outer conductive surfaces that are insulated from each other and the central conductive surface by the respective intervening piezoelectric plate element thicknesses, said bender-type piezoelectric switching device further including at least one set of coacting electrical switch contacts opened and closed by the prepolarized movable bender member of the piezoelectric ceramic switching device, and clamping means securing a different non-poled portion of the piezoelectric ceramic plate elements adjacent to and mechanically supporting the selectively prepoled movable bender member portion in a cantilever manner for opening and closing the set of coacting electrical contacts, the different non-poled portions of the piezoelectric ceramic plate elements disposed under said clamping means remaining non-movable as being mechanically unstrained and electrically neutral, wherein the unpoled piezoelectric plate element portions extend beyond the clamped portion thereof in a direction opposite from the prepoled movable bender portion and carry switch energization circuit means which selectively applies a source of bender energization potential to the prepoled movable bender portion of each prepoled piezoelectric plate element having the same polarity as the polarity of the prepoled electric field previously permanently induced in said prepoled movable bender portions so that no depolarization of the piezoelectric plate elements occurs during successive operation of the piezoelectric ceramic bender-type switching device.

10. A piezoelectric ceramic switching device as in claim 9 wherein said switch energization circuit means includes electrical circuit components comprising either active semiconductor devices or passive circuit elements or both fabricated either in discrete, hybrid or monolithic integrated circuit from physically formed on and/or supported by the unpoled piezoelectric plate element portions extending beyond the clamping means.

*11. Electrical switching apparatus comprising*

*(a) at least one piezoelectric ceramic bender-type switching device having a movable piezoceramic bender member, said bender member having at least two planar piezoceramic plate elements secured in opposed parallel relationship sandwich fashion on opposite sides of at least one central conductive surface and having respective outer conductive surfaces that are insulated from each other and the central conductive surface by the respective intervening piezoceramic plate element thicknesses,*

*(b) the piezoceramic plate elements further including polarized and unpolarized portions when conducting the switching operation with at least one set of coacting electrical switch contacts being opened and closed by the polarized portions thereof,*

*(c) clamping means securing the piezoceramic plate elements together and mechanically supporting the unpolarized portions thereof in a cantilever manner for opening and closing the set of coacting the electrical contacts, and*

*(d) selectively operable electric excitation circuit means connected to the piezoelectric ceramic bender-type switching device for selectively and respectively actuating the polarized portions of each piezoceramic plate element thereof with a direct current energizing potential which is applied in the same direction employed to produce initial polarization in the polarized portions of the respective plate elements,*

*(e) the electric excitation circuit means being connected in circuit relationship across the respective ones of the piezoceramic plate elements of the piezoelectric ceramic bender-type switching device for selectively closing or opening the set of coacting electrical switch contacts to control electric current being supplied through a load by the opening and closing of the switch.*

*12. The piezoceramic switching means of claim 11 wherein the movable bender member includes coacting electrical switch contacts disposed on opposite sides to selectively make or break at least two separate electrically conductive paths extending through the respective sets of contacts.*

*13. The piezoceramic switching means of claim 11 wherein the electric excitation circuit means includes multiplier circuit means for increasing the value of direct current energization potential to a level suitable for actuating the piezoelectric ceramic bender-type switching device.*

*14. The piezoceramic switching means of claim 11 which further includes circuit means to prevent excess arcing across the coacting electrical contacts when opened to interrupt the electrical current being supplied through a load.*

*15. A piezoelectric switching device comprising:*

*at least one bender member having two planar piezoelectric plate elements secured in sandwich fashion on opposite sides of at least one central conductive surface;*

*an outer conductive surface secured to each of said plate elements so that said outer conductive surfaces are insulated from each other and said central conductive surface by said plate elements;*

*said bender member further including at least one set of coacting electrical switch contacts opened and closed* by a movable end of a movable bender portion of said bender member;

means for clamping a non-bending portion of said bender member, said clamping means being adjacent to and mechanically supporting said bender portion in a cantilever manner for opening and closing said set of coacting electrical contacts;

said non-bending portion of said bender member which is disposed under said clamping means remaining non-movable and being electrically insulated from said conductive surfaces;

wherein said non-bending portion extends beyond said clamped portion thereof in a direction opposite from said bender portion to form a further piezoelectric plate element portion, said non-bending portion having conductive surfaces for forming capacitors which are usable as circuit components in an electrical circuit for controlling operation of said bender member, said capacitors having any desired capacitance value in the range of tenths of a microfarad and greater, said capacitance value being dependent upon power rating.

16. The device of claim 15 wherein:

portions of said plate elements disposed under said clamping means do not have outer conductive surfaces;

said central and outer conductive surfaces are selectively formed following fabrication of said plate elements to desired size, with side edges of said conductive surfaces being recessed relative to side edges of said plate elements to thereby provide increased voltage stress withstandability around side edges of said bender member;

said bender member further including a conformal electrically insulating coating that extends over and covers said outer conductive surfaces and said side edges of said plate elements in said bender portion, and further extends over and covers said side edges of said plate elements and said central conductive surface sandwiched therebetween at least over said bender portion; and said coating also extending down to and covering said portions of said plate elements exposed by the removal of said outer conductive surfaces thereon as well as edge portions of said outer conductive surfaces exposed by such removal.

17. The device of claim 16 further including electrical rcuit components comprising either active semiconductor vices, passive circuit elements or both, fabricated either discrete, hybrid or monolithic integrated circuit form, ysically formed on and/or supported by said non-bend- g portion, and also including preformed conductive path- ys selectively formed by appropriate fabrication of said nductive surfaces on said non-bending portion to inter- nnect said circuit components.

18. The device of claim 15 further including electrical cuit components comprising either active semiconductor ices, passive circuit elements or both, fabricated either discrete, hybrid or monolithic integrated circuit form, sically formed on and/or supported by said non-bend- portion, and also including preformed conductive path- s selectively formed by appropriate fabrication of said conductive surfaces on said non-bending portion to interconnect said circuit components.

19. The device of claim 15 further including a relatively thin flexible stiffening member secured widthwise across said movable end of said movable bender portion.

20. The device of claim 16 further including a relatively thin inflexible stiffening member secured widthwise across said movable end of said movable bender portion.

21. The device of claim 15 further including an extended length of a portion of said central conductive surface in the form of a conductive foil which is bent back over the top of a stiffening member and secured thereto to form an exposed electrical contact electrically and physically connected to said central conductive surface for coacting with an opposed electrical contact to close or open an electrical circuit therethrough upon energization of the device.

22. The device of claim 19 wherein an extended length of a portion of said central conductive surface is provided in the form of a conductive foil, is bent back over the top of said stiffening member and is secured thereto to form an exposed electrical contact, said contact being electrically and physically connected to said central conductive surface for coacting with an opposed electrical contact to close or open an electrical circuit therethrough upon energization of the device.

23. A piezoelectric switching device comprising:

at least one bender member having two planar piezoelectric plate elements secured in sandwich fashion on opposite sides of at least one central conductive surface;

an outer conductive surface secured to each of said plate elements so that said outer conductive surfaces are insulated from each other and said central conductive surface by said plate elements;

said bender member further including at least one set of coacting electrical switch contacts opened and closed by a movable end of a movable bender portion of said bender member; and means for clamping a different non-bending portion of said bender member adjacent to and mechanically supporting said bender portion in a cantilever manner for opening and closing said set of coating electrical contacts;

said non-bending portion remaining non-movable and electrically insulated from said conductive surfaces, wherein said non-bending portion extends beyond said clamped portion thereof in a direction opposite from said bender portion and carries switch energization circuit means which selectively applies a source of bender energization potential to said bender portion, said source having a single selected polarity so that no depolarization of said piezoelectric plate elements occurs during successive operation of the switching device.

24. The device of claim 23 wherein said switch energization circuit means includes electrical circuit components including active semiconductor devices, passive circuit elements or both, fabricated either in discrete, hybrid or monolithic integrated circuit form, physically formed on and/or supported by said non-bending portion.

* * * * *